United States Patent
Yamazaki et al.

(10) Patent No.: US 12,402,360 B2
(45) Date of Patent: Aug. 26, 2025

(54) SEMICONDUCTOR DEVICE

(71) Applicant: Semiconductor Energy Laboratory Co., Ltd., Atsugi (JP)

(72) Inventors: Shunpei Yamazaki, Setagaya (JP); Masayuki Sakakura, Isehara (JP); Hideomi Suzawa, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/611,835

(22) Filed: Mar. 21, 2024

(65) Prior Publication Data

US 2024/0266444 A1    Aug. 8, 2024

Related U.S. Application Data

(63) Continuation of application No. 18/133,078, filed on Apr. 11, 2023, now Pat. No. 11,949,021, which is a
(Continued)

(30) Foreign Application Priority Data

May 20, 2013 (JP) ................................. 2013-106337

(51) Int. Cl.
*H10D 30/67* (2025.01)
*H10B 99/00* (2023.01)
(Continued)

(52) U.S. Cl.
CPC ......... *H10D 30/6757* (2025.01); *H10B 99/00* (2023.02); *H10D 30/6755* (2025.01);
(Continued)

(58) Field of Classification Search
CPC ............... H10B 99/00; H10D 30/6755; H10D 30/6756; H10D 62/40; H10D 62/405;
(Continued)

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

EP    1737044 A    12/2006
EP    2226847 A     9/2010
(Continued)

OTHER PUBLICATIONS

Nakayama.M et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.
(Continued)

*Primary Examiner* — Victor A Mandala
(74) *Attorney, Agent, or Firm* — Eric J. Robinson; Robinson Intellectual Property Law Office, P.C.

(57) ABSTRACT

A semiconductor device having a structure which can prevent a decrease in electrical characteristics due to miniaturization is provided. The semiconductor device includes, over an insulating surface, a stack in which a first oxide semiconductor layer and a second oxide semiconductor layer are sequentially formed, and a third oxide semiconductor layer covering part of a surface of the stack. The third oxide semiconductor layer includes a first layer in contact with the stack and a second layer over the first layer. The first layer includes a microcrystalline layer, and the second layer includes a crystalline layer in which c-axes are aligned in a direction perpendicular to a surface of the first layer.

7 Claims, 15 Drawing Sheets

Related U.S. Application Data continuation of application No. 17/564,518, filed on Dec. 29, 2021, now Pat. No. 11,646,380, which is a continuation of application No. 16/923,160, filed on Jul. 8, 2020, now Pat. No. 11,217,704, which is a continuation of application No. 16/558,601, filed on Sep. 3, 2019, now Pat. No. 10,720,532, which is a continuation of application No. 16/126,348, filed on Sep. 10, 2018, now Pat. No. 10,411,136, which is a continuation of application No. 15/828,759, filed on Dec. 1, 2017, now Pat. No. 10,128,384, which is a continuation of application No. 15/246,927, filed on Aug. 25, 2016, now Pat. No. 9,837,552, which is a continuation of application No. 15/049,554, filed on Feb. 22, 2016, now Pat. No. 9,431,547, which is a continuation of application No. 14/276,294, filed on May 13, 2014, now Pat. No. 9,281,408.

(51) Int. Cl.
| | |
|---|---|
| *H10D 30/62* | (2025.01) |
| *H10D 62/40* | (2025.01) |
| *H10D 62/80* | (2025.01) |
| *H10D 86/40* | (2025.01) |
| *H10D 86/60* | (2025.01) |
| *H10D 99/00* | (2025.01) |
| *H10F 39/00* | (2025.01) |

(52) U.S. Cl.
CPC ......... *H10D 30/6756* (2025.01); *H10D 62/40* (2025.01); *H10D 62/405* (2025.01); *H10D 62/80* (2025.01); *H10D 86/423* (2025.01); *H10D 86/60* (2025.01); *H10D 99/00* (2025.01); *H10F 39/80377* (2025.01); *H10D 30/6213* (2025.01)

(58) Field of Classification Search
CPC ...... H10D 62/80; H10D 86/423; H10D 86/60; H10D 99/00; H10D 30/6213; H10D 30/6757; H10F 39/80377; H10F 88/00; H02K 15/027; H02K 15/28; A01G 13/20; H10H 20/01
See application file for complete search history.

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih. et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,405,449 | B2 | 7/2008 | Yagishita |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,605,422 | B2 | 10/2009 | Saitoh et al. |
| 7,674,650 | B2 | 3/2010 | Akimoto et al. |
| 7,732,819 | B2 | 6/2010 | Akimoto et al. |
| 7,791,072 | B2 | 9/2010 | Kumomi et al. |
| 7,994,500 | B2 | 8/2011 | Kim et al. |
| 8,058,645 | B2 | 11/2011 | Jeong et al. |
| 8,093,589 | B2 | 1/2012 | Sugihara et al. |
| 8,148,779 | B2 | 4/2012 | Jeong et al. |
| 8,188,480 | B2 | 5/2012 | Itai |
| 8,202,365 | B2 | 6/2012 | Umeda et al. |
| 8,203,143 | B2 | 6/2012 | Imai |
| 8,237,166 | B2 | 8/2012 | Kumomi et al. |
| 8,274,078 | B2 | 9/2012 | Itagaki et al. |
| 8,343,800 | B2 | 1/2013 | Umeda et al. |
| 8,502,221 | B2 | 8/2013 | Yamazaki |
| 8,530,285 | B2 | 9/2013 | Yamazaki et al. |
| 8,541,258 | B2 | 9/2013 | Kim et al. |
| 8,624,240 | B2 | 1/2014 | Sato et al. |
| 8,633,480 | B2 | 1/2014 | Yamazaki et al. |
| 8,669,556 | B2 | 3/2014 | Yamazaki et al. |
| 8,680,522 | B2 | 3/2014 | Yamazaki et al. |
| 8,686,425 | B2 | 4/2014 | Yamazaki et al. |
| 8,692,252 | B2 | 4/2014 | Takata et al. |
| 8,748,215 | B2 | 6/2014 | Yamazaki |
| 8,748,881 | B2 | 6/2014 | Yamazaki |
| 8,748,886 | B2 | 6/2014 | Yamazaki et al. |
| 8,765,522 | B2 | 7/2014 | Yamazaki |
| 8,779,420 | B2 | 7/2014 | Yamazaki |
| 8,847,220 | B2 | 9/2014 | Yamazaki |
| 8,890,152 | B2 | 11/2014 | Yamazaki et al. |
| 8,901,552 | B2 * | 12/2014 | Yamazaki ............... H10D 62/40 257/43 |
| 8,916,868 | B2 | 12/2014 | Isobe et al. |
| 8,952,377 | B2 | 2/2015 | Yamazaki et al. |
| 8,987,728 | B2 | 3/2015 | Honda et al. |
| 8,994,021 | B2 | 3/2015 | Yamazaki et al. |
| 9,006,803 | B2 | 4/2015 | Isobe et al. |
| 9,059,295 | B2 | 6/2015 | Yamazaki |
| 9,076,874 | B2 | 7/2015 | Yamazaki et al. |
| 9,093,544 | B2 | 7/2015 | Yamazaki et al. |
| 9,099,437 | B2 | 8/2015 | Uochi |
| 9,214,520 | B2 | 12/2015 | Yamazaki |
| 9,236,491 | B2 | 1/2016 | Takata et al. |
| 9,287,294 | B2 * | 3/2016 | Yamazaki ............... C04B 35/58 |
| 9,287,409 | B2 | 3/2016 | Yamazaki et al. |
| 9,331,208 | B2 | 5/2016 | Yamazaki et al. |
| 9,472,677 | B2 | 10/2016 | Yamazaki |
| 9,478,668 | B2 | 10/2016 | Takahashi et al. |
| 9,490,351 | B2 | 11/2016 | Honda et al. |
| 9,520,287 | B2 | 12/2016 | Yamazaki |
| 9,548,397 | B2 | 1/2017 | Yamazaki et al. |
| 9,559,193 | B2 | 1/2017 | Isobe et al. |
| 9,601,636 | B2 | 3/2017 | Yamazaki et al. |
| 9,711,655 | B2 | 7/2017 | Yamazaki et al. |
| 9,768,307 | B2 | 9/2017 | Yamazaki et al. |
| 9,799,773 | B2 | 10/2017 | Godo et al. |
| 9,842,937 | B2 | 12/2017 | Yamazaki |
| 9,887,298 | B2 | 2/2018 | Yamazaki |
| 9,893,201 | B2 | 2/2018 | Takahashi et al. |
| 9,954,115 | B2 * | 4/2018 | Yamazaki .......... H10D 30/6704 |
| 10,079,295 | B2 | 9/2018 | Isobe et al. |
| 10,079,310 | B2 | 9/2018 | Yamazaki |
| 10,263,120 | B2 | 4/2019 | Yamazaki |
| 10,347,771 | B2 | 7/2019 | Yamazaki |
| 10,608,118 | B2 | 3/2020 | Yamazaki |
| 10,644,164 | B2 | 5/2020 | Takahashi et al. |
| 10,714,626 | B2 | 7/2020 | Yamazaki |
| 10,998,449 | B2 | 5/2021 | Takahashi et al. |
| 11,133,419 | B2 | 9/2021 | Yamazaki |
| 11,710,795 | B2 | 7/2023 | Yamazaki |
| 11,799,033 | B2 | 10/2023 | Takahashi et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |

(56) References Cited

U.S. PATENT DOCUMENTS

| | | |
|---|---|---|
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0023698 A1 | 1/2008 | Li et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0054346 A1 | 3/2008 | Saitoh et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0189153 A1 | 7/2009 | Iwasaki et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0102313 A1 | 4/2010 | Miyairi et al. |
| 2010/0109002 A1 | 5/2010 | Itagaki et al. |
| 2010/0117074 A1 | 5/2010 | Yamazaki et al. |
| 2010/0320458 A1 | 12/2010 | Umeda et al. |
| 2011/0062436 A1 | 3/2011 | Yamazaki et al. |
| 2011/0134683 A1* | 6/2011 | Yamazaki ............ H10D 88/00 257/43 |
| 2011/0140100 A1* | 6/2011 | Takata ............ H10D 30/6755 257/43 |
| 2011/0175090 A1 | 7/2011 | Sugihara et al. |
| 2011/0215328 A1 | 9/2011 | Morosawa et al. |
| 2011/0240991 A1 | 10/2011 | Yamazaki |
| 2012/0032163 A1 | 2/2012 | Yamazaki |
| 2012/0051119 A1* | 3/2012 | Yamazaki ............. H10D 86/60 257/296 |
| 2012/0061662 A1* | 3/2012 | Yamazaki .......... H10D 30/6755 257/E29.264 |
| 2012/0104385 A1* | 5/2012 | Godo ................ H10D 30/6734 257/E29.296 |
| 2012/0112257 A1* | 5/2012 | Kato ..................... H10B 41/20 257/296 |
| 2012/0119205 A1 | 5/2012 | Taniguchi et al. |
| 2012/0119207 A1 | 5/2012 | Goto et al. |
| 2012/0132903 A1* | 5/2012 | Yamazaki ......... H01L 21/02502 257/E29.296 |
| 2012/0132908 A1 | 5/2012 | Sugihara et al. |
| 2012/0146053 A1 | 6/2012 | Saitoh et al. |
| 2012/0146713 A1 | 6/2012 | Kim et al. |
| 2012/0161122 A1* | 6/2012 | Yamazaki .......... H10D 30/6755 257/43 |
| 2012/0175610 A1* | 7/2012 | Yamazaki .............. H10D 99/00 257/E29.296 |
| 2012/0187395 A1* | 7/2012 | Koezuka .......... H10D 30/6756 257/E29.296 |
| 2012/0256179 A1 | 10/2012 | Yamazaki et al. |
| 2012/0261657 A1* | 10/2012 | Takahashi ......... H01L 21/02565 257/E29.105 |
| 2012/0319102 A1 | 12/2012 | Yamazaki et al. |
| 2012/0319183 A1 | 12/2012 | Yamazaki et al. |
| 2013/0009209 A1* | 1/2013 | Yamazaki .......... H10D 30/6758 257/E21.409 |
| 2013/0009219 A1* | 1/2013 | Yamazaki ............ H10D 62/405 257/E21.409 |
| 2013/0009220 A1* | 1/2013 | Yamazaki .......... H10D 30/6757 257/288 |
| 2013/0052799 A1 | 2/2013 | Ohki |
| 2013/0075735 A1* | 3/2013 | Watanabe .......... H10D 30/6704 257/E21.409 |
| 2013/0099231 A1* | 4/2013 | Tochibayashi ..... H10D 30/6755 257/E29.296 |
| 2013/0176516 A1 | 7/2013 | Ishitani et al. |
| 2013/0187161 A1* | 7/2013 | Yamazaki .......... H10D 30/6755 438/158 |
| 2013/0207112 A1* | 8/2013 | Isobe ..................... H10D 86/60 257/57 |
| 2013/0264563 A1* | 10/2013 | Okazaki ................ H10D 99/00 257/43 |
| 2013/0270550 A1* | 10/2013 | Okazaki ............... H10D 86/60 257/43 |
| 2013/0288426 A1* | 10/2013 | Akimoto ................ H10B 41/70 438/104 |
| 2013/0313550 A1 | 11/2013 | Yamazaki |
| 2013/0320330 A1* | 12/2013 | Yamazaki .......... H10D 30/6734 257/43 |
| 2013/0320334 A1 | 12/2013 | Yamazaki et al. |
| 2014/0017834 A1* | 1/2014 | Yamazaki .............. H10D 86/60 438/30 |
| 2014/0042433 A1 | 2/2014 | Yamazaki |
| 2014/0042434 A1 | 2/2014 | Yamazaki |
| 2014/0077205 A1 | 3/2014 | Yamazaki et al. |
| 2014/0131704 A1 | 5/2014 | Yamazaki et al. |
| 2014/0183530 A1 | 7/2014 | Yamazaki et al. |
| 2014/0306217 A1 | 10/2014 | Yamazaki et al. |
| 2014/0339544 A1 | 11/2014 | Hanaoka et al. |
| 2015/0060846 A1 | 3/2015 | Yamamoto. et al. |
| 2015/0179776 A1 | 6/2015 | Isobe et al. |
| 2015/0236054 A1 | 8/2015 | Yamazaki et al. |
| 2015/0333089 A1 | 11/2015 | Yamazaki et al. |
| 2016/0013298 A1* | 1/2016 | Yamazaki ............. H01L 21/477 438/104 |
| 2016/0163871 A1 | 6/2016 | Yamazaki |
| 2016/0190332 A1* | 6/2016 | Honda .................. H10D 99/00 438/104 |
| 2016/0211267 A1* | 7/2016 | Atsumi ................. H10B 12/05 |
| 2017/0236943 A1* | 8/2017 | Yamazaki .......... H10D 30/6713 257/43 |
| 2017/0309754 A1 | 10/2017 | Yamazaki et al. |
| 2018/0076204 A1* | 3/2018 | Matsubayashi .... H10D 30/6728 |
| 2018/0114844 A1* | 4/2018 | Yamazaki ............ H10K 10/466 |

(56) References Cited

U.S. PATENT DOCUMENTS

| | | |
|---|---|---|
| 2021/0020783 A1 | 1/2021 | Yamazaki |
| 2023/0299207 A1 | 9/2023 | Yamazaki |
| 2024/0079499 A1 | 3/2024 | Takahashi et al. |

FOREIGN PATENT DOCUMENTS

| | | |
|---|---|---|
| EP | 2544237 A | 1/2013 |
| EP | 3217435 A | 9/2017 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-100600 A | 4/2006 |
| JP | 2006-165528 A | 6/2006 |
| JP | 2006-339556 A | 12/2006 |
| JP | 2008-060440 A | 3/2008 |
| JP | 2009-224357 A | 10/2009 |
| JP | 2009-231613 A | 10/2009 |
| JP | 2009-266938 A | 11/2009 |
| JP | 2010-016347 A | 1/2010 |
| JP | 4415062 | 2/2010 |
| JP | 2010-067954 A | 3/2010 |
| JP | 2010-073881 A | 4/2010 |
| JP | 2010-177431 A | 8/2010 |
| JP | 4571221 | 10/2010 |
| JP | 2011-049544 A | 3/2011 |
| JP | 2011-086923 A | 4/2011 |
| JP | 2011-119718 A | 6/2011 |
| JP | 2011-124360 A | 6/2011 |
| JP | 2011-135063 A | 7/2011 |
| JP | 2011-135064 A | 7/2011 |
| JP | 2011-135066 A | 7/2011 |
| JP | 2012-033836 A | 2/2012 |
| JP | 2012-054547 A | 3/2012 |
| JP | 2012-124296 A | 6/2012 |
| JP | 2012-134475 A | 7/2012 |
| JP | 2012-160679 A | 8/2012 |
| JP | 2012-178493 A | 9/2012 |
| JP | 2012-191131 A | 10/2012 |
| JP | 2012-199534 A | 10/2012 |
| JP | 2012-216797 A | 11/2012 |
| JP | 2012-231133 A | 11/2012 |
| JP | 2012-235098 A | 11/2012 |
| JP | 2012-235107 A | 11/2012 |
| JP | 2012-256838 A | 12/2012 |
| JP | 2013-021313 A | 1/2013 |
| JP | 2013-038401 A | 2/2013 |
| JP | 2013-042121 A | 2/2013 |
| KR | 2012-0120062 A | 11/2012 |
| KR | 2013-0007426 A | 1/2013 |
| KR | 2013-0014562 A | 2/2013 |
| KR | 2014-0024866 A | 3/2014 |
| TW | 200505016 | 2/2005 |
| TW | 201306265 | 2/2013 |
| WO | WO-2004/114391 | 12/2004 |
| WO | WO-2008/133345 | 11/2008 |
| WO | WO-2011/033936 | 3/2011 |
| WO | WO-2011/055620 | 5/2011 |
| WO | WO-2011/065210 | 6/2011 |
| WO | WO-2011/065216 | 6/2011 |
| WO | WO-2011/065243 | 6/2011 |
| WO | WO-2011/122363 | 10/2011 |
| WO | WO-2012/073844 | 6/2012 |
| WO | WO-2012/117778 | 9/2012 |
| WO | WO-2012/172746 | 12/2012 |

OTHER PUBLICATIONS

Asakuma.N et al., "Crystallization and Reduction of Sol-Gel-Derived Zinc Oxide Films By Irradiation With Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions On Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: the "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS On Glass and Plastic Substrates Fabricated By TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:NUMERICAL Analysis On Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al.,"42.1: Invited Paper: Improved Amorphous In—Ga—Zn—O Tfts", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

(56) References Cited

OTHER PUBLICATIONS

Janotti.A et al., "Native Point Defects In ZnO", Phys. Rev. B (Physical Review. B), Oct. 4, 2007, vol. 76, No. 16, pp. 165202-1-165202-22.

Janotti.A et al., "Oxygen Vacancies In ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper: World-Largest (6.5") Flexible Full Color Top Emission AMOLED Display On Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL, YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu, or Zn] At Temperatures Over 1000°C", Journal of Solid State Chemistry, 1985, vol. 60, pp. 382-384, Elsevier.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178, Elsevier.

Kitzerow.H et al., "Observation of Blue Phases in Chiral Networks", Liquid Crystals, 1993, vol. 14, No. 3, pp. 911-916.

Kurokawa. Y et al., "UHF RFCPUS On Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status Of, Challenges To, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4: Excellent Performance of Indium-Oxide-Based Thin-Film Transistors By DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355, Elsevier.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics On Their Way To Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350°C", Journal of Solid State Chemistry, Aug. 1, 1991, vol. 93, No. 2, pp. 298-315, Elsevier.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of Zno Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure To Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

(56) References Cited

OTHER PUBLICATIONS

Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.

Park.S et al., "Challenge To Future Displays: Transparent AM-OLED Driven By Peald Grown ZnO TFT", IMID '07 DIGEST, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide Tfts", IDW '09 : Proceedings of the 16th International Display Workshops, 2009, pp. 689-692.

Son.K et al., "42.4L: Late-News Paper: 4 Inch QVGA AMOLED Driven By the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor On SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Taiwanese Office Action (Application No. 103117311) Dated Aug. 21, 2017.

Taiwanese Office Action (Application No. 107109302) Dated Dec. 14, 2018.

* cited by examiner

SEMICONDUCTOR DEVICE

BACKGROUND OF THE INVENTION

1. Field of the Invention

One embodiment of the present invention relates to a semiconductor device including an oxide semiconductor.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a storage device, a display device, or an electronic device includes a semiconductor device.

2. Description of the Related Art

Attention has been focused on a technique for forming a transistor using a semiconductor thin film formed over a substrate having an insulating surface (also referred to as a thin film transistor (TFT)). The transistor is used in a wide range of electronic devices such as an integrated circuit (IC) and an image display device (display device). A silicon-based semiconductor material is widely known as a material for a semiconductor thin film applicable to a transistor. As another example, an oxide semiconductor has been attracting attention.

For example, a transistor whose active layer includes an amorphous oxide semiconductor containing indium (In), gallium (Ga), and zinc (Zn) is disclosed in Patent Document 1.

REFERENCE

Patent Document

[Patent Document 1] Japanese Published Patent Application No. 2006-165528

SUMMARY OF THE INVENTION

High integration of an integrated circuit requires miniaturization of a transistor. However, it is known that miniaturization of a transistor causes deterioration of or variations in the electrical characteristics of the transistor. This means that miniaturization of a transistor is likely to decrease in the yield of an integrated circuit.

Thus, one object of one embodiment of the present invention is to provide a semiconductor device in which deterioration of electrical characteristics which becomes more noticeable as the transistor is miniaturized can be suppressed. Another object is to provide a semiconductor device having a structure with which a decrease in a yield due to miniaturization can be suppressed. Another object is to provide a semiconductor device having a high degree of integration. Another object is to provide a semiconductor device in which deterioration of on-state current characteristics is reduced. Another object is to provide a semiconductor device with low power consumption. Another object is to provide a semiconductor device with high reliability. Another object is to provide a semiconductor device which can retain data even when power supply is stopped. Another object is to provide a novel semiconductor device.

Note that the descriptions of these objects do not disturb the existence of other objects. Note that in one embodiment of the present invention, there is no need to achieve all the objects. Other objects are apparent from and can be derived from the description of the specification, the drawings, the claims, and the like.

One embodiment of the present invention relates to a semiconductor device having a stack including oxide semiconductor layers.

One embodiment of the present invention is a semiconductor device including, over an insulating surface, a stack in which a first oxide semiconductor layer and a second oxide semiconductor layer are sequentially formed, and a third oxide semiconductor layer. The third oxide semiconductor layer covers part of a first side surface, part of a top surface, and part of a second side surface opposite to the first side surface of the stack. The third oxide semiconductor layer includes a first layer in contact with the stack, and a second layer over the first layer. The first layer includes a microcrystalline layer, and the second layer includes a crystalline layer in which c-axes are aligned in a direction perpendicular to a surface of the first layer.

Another embodiment of the present invention is a semiconductor device including, over an insulating surface, a stack in which a first oxide semiconductor layer and a second oxide semiconductor layer are sequentially formed; a source electrode layer and a drain electrode layer each partly in contact with the stack; a third oxide semiconductor layer partly in contact with each of the insulating surface, the stack, the source electrode layer, and the drain electrode layer; a gate insulating film over the third oxide semiconductor layer; a gate electrode layer over the gate insulating film; and an insulating layer over the source electrode layer, the drain electrode layer, and the gate electrode layer. The third oxide semiconductor layer includes a first layer in contact with the stack, and a second layer over the first layer. The first layer includes a microcrystalline layer, and the second layer includes a crystalline layer in which c-axes are aligned in a direction perpendicular to a surface of the first layer.

Note that in this specification and the like, ordinal numbers such as "first" and "second" are used in order to avoid confusion among components and do not limit the components numerically.

The first oxide semiconductor layer preferably includes a crystalline layer in which c-axes are aligned in a direction perpendicular to the insulating surface. The second oxide semiconductor layer preferably includes a crystalline layer in which c-axes are aligned in a direction perpendicular to a top surface of the first oxide semiconductor layer.

Further, a surface of the second oxide semiconductor layer is preferably curved in a region where the stack is in contact with the third oxide semiconductor layer.

Further, a conduction band minimum of the first oxide semiconductor layer and a conduction band minimum of the third oxide semiconductor layer are preferably closer to a vacuum level than a conduction band minimum of the second oxide semiconductor layer by 0.05 eV or more and 2 eV or less.

It is preferable that the first to third oxide semiconductor layers each include an In-M-Zn oxide (M is Al, Ti, Ga, Y, Zr, La, Ce, Nd, or Hf), and that an atomic ratio of M with respect to In in each of the first and third oxide semiconductor layers be higher than an atomic ratio of M with respect to In in the second oxide semiconductor layer.

According to one embodiment of the present invention, any of the following effects can be achieved: to provide a semiconductor device in which deterioration of electrical characteristics which becomes more noticeable as the semiconductor device is miniaturized can be suppressed, to provide a semiconductor device that can be miniaturized in a simple process, to provide a semiconductor device having a structure with which a decrease in a yield due to miniaturization can be suppressed, to provide a semiconductor device having a high degree of integration, to provide a semiconductor device in which deterioration of on-state current characteristics is reduced, to provide a semiconductor device with low power consumption, to provide a semiconductor device with high reliability, to provide a semiconductor device which can retain data even when power supply is stopped, and to provide a novel semiconductor device.

Note that the descriptions of these effects do not disturb the existence of other effects. In one embodiment of the present invention, there is no need to obtain all the effects. Other effects are apparent from and can be derived from the description of the specification, the drawings, the claims, and the like.

DETAILED DESCRIPTION OF THE INVENTION

Figure 1A:
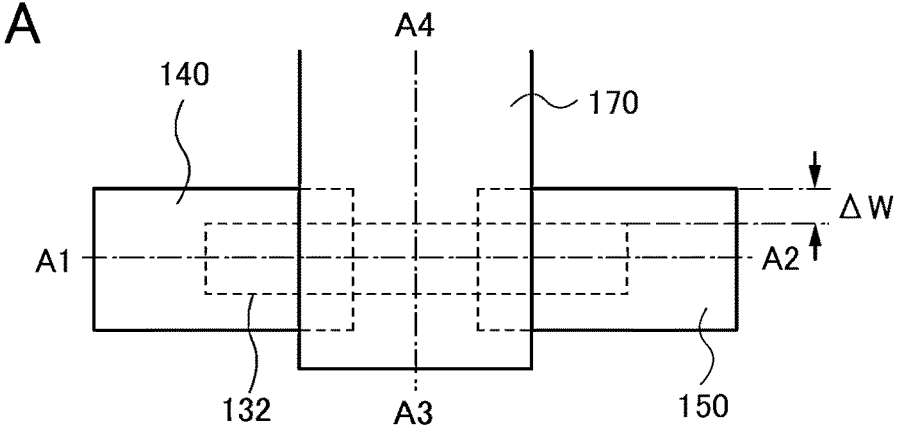
FIGS. 1A to 1C are a top view and cross-sectional views of a transistor.

Embodiments are described in detail with reference to the drawings. Note that the present invention is not limited to the following description and it is readily appreciated by those skilled in the art that modes and details can be modified in various ways without departing from the spirit and the scope of the present invention. Therefore, the present invention should not be limited to the descriptions of the embodiments below. Note that in structures of the present invention described below, the same portions or portions having similar functions are denoted by the same reference numerals in different drawings, and description thereof is omitted in some cases.

Note that in this specification and the like, when it is explicitly described that X and Y are connected, the case where X and Y are electrically connected, the case where X and Y are functionally connected, and the case where X and Y are directly connected are included therein. Here, each of X and Y denotes an object (e.g., a device, an element, a circuit, a wiring, an electrode, a terminal, a conductive film, a layer, or the like). Accordingly, a connection relation other than connection relations shown in the drawings and texts is also included, without being limited to a predetermined connection relation, for example, a connection relation shown in the drawings and texts.

In the case where X and Y are electrically connected, one or more elements (e.g., a switch, a transistor, a capacitor, an inductor, a resistor, a diode, a display element, a light-emitting element, and a load) that enable an electrical connection between X and Y can be connected between X and Y, for example. Note that the switch is controlled to be turned on or off. That is, the switch has a function of determining whether current flows or not by being turned on or off (becoming an on state and an off state). Alternatively, the switch has a function of selecting and changing a current path.

In the case where X and Y are functionally connected, one or more circuits (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; and a control circuit) that enable a functional connection between X and Y can be connected between X and Y, for example. Note that for example, in the case where a signal output from X is transmitted to Y even when another circuit is interposed between X and Y, X and Y are functionally connected.

Note that when it is explicitly described that X and Y are connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that "X and Y are electrically connected", the description is the same as the case where it is explicitly only described that "X and Y are connected".

Even when independent components are electrically connected to each other in a circuit diagram, one component has functions of a plurality of components in some cases. For example, when part of a wiring also functions as an electrode, one conductive film functions as the wiring and the electrode. Thus, an "electrical connection" in this specification includes in its category such a case where one conductive film has functions of a plurality of components.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, each of X, Y, Z1, and Z2 denotes an object (e.g., a device, an element, a circuit, a wiring, an electrode, a terminal, a conductive film, a layer, or the like).

Note that in this specification and the like, a transistor can be formed using any of a variety of substrates. The type of a substrate is not limited to a certain type. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of a glass substrate include a barium borosilicate glass substrate, an aluminoborosilicate glass substrate, and a soda lime glass substrate. For a flexible substrate, a flexible synthetic resin such as plastics typified by polyethylene terephthalate (PET), polyethylene naphthalate (PEN), and polyether sulfone (PES), or acrylic can be used, for example. Examples of an attachment film include attachment films formed using polypropylene, polyester, polyvinyl fluoride, polyvinyl chloride, and the like. Examples of a base film include a polyester base film, a polyamide base film, a polyimide base film, an inorganic vapor deposition film, paper, and the like. Specifically, when a transistor is formed using a semiconductor substrate, a single crystal substrate, an SOI substrate, or the like, a transistor with few variations in characteristics, size, shape, or the like, high current supply capability, and a small size can be formed. By forming a circuit using such a transistor, power consumption of the circuit can be reduced or the circuit can be highly integrated.

Alternatively, a flexible substrate may be used as the substrate, and the transistor may be provided directly on the flexible substrate. Further alternatively, a separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, a transistor may be formed using one substrate, and then transferred to another substrate. Examples of a substrate to which a transistor is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. With the use of such a substrate, a transistor with excellent properties, a transistor with low power consumption, or a device with high durability can be formed, high heat resistance can be provided, or a reduction in weight or thinning can be achieved.

Embodiment 1

In this embodiment, a semiconductor device of one embodiment of the present invention is described with reference to drawings.

Figure 1B:
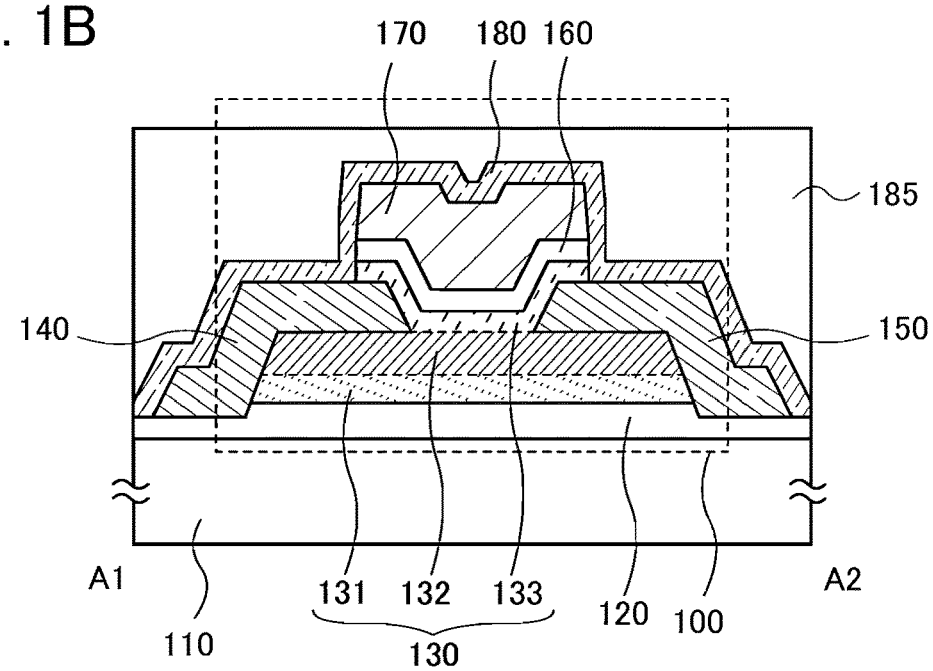
Figure 1C:
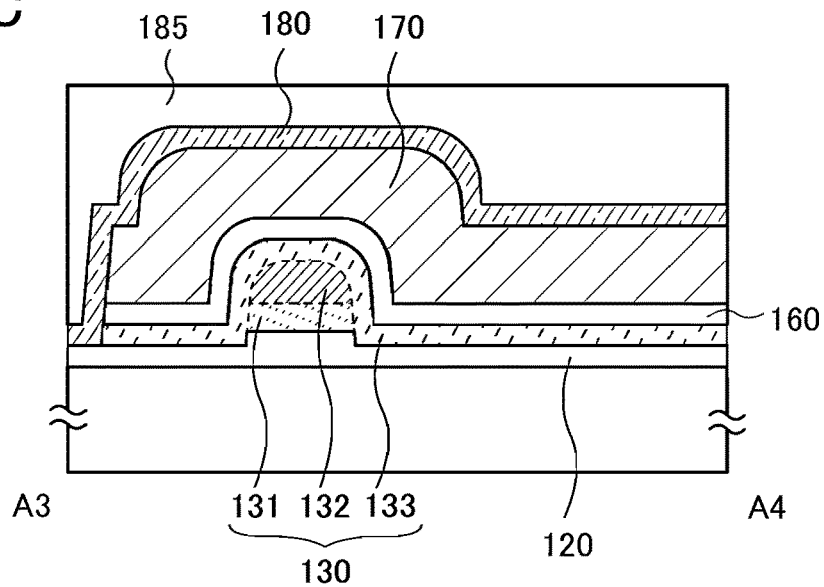

FIGS. 1A to 1C are a top view and cross-sectional views of a transistor of one embodiment of the present invention. FIG. 1A is the top view. FIG. 1B illustrates a cross section taken along dashed-dotted line A1-A2 in FIG. 1A. FIG. 1C is a cross-sectional view taken along dashed-dotted line A3-A4 in FIG. 1A. Note that for simplification of the drawing, some components are not illustrated in the top view in FIG. 1A. In some cases, the direction of the dashed-dotted line A1-A2 is referred to as a channel length direction, and the direction of the dashed-dotted line A3-A4 is referred to as a channel width direction.

A transistor 100 illustrated in FIGS. 1A to 1C and FIG. 2 includes a base insulating film 120 formed over a substrate 110; a stack in which a first oxide semiconductor layer 131 and a second oxide semiconductor layer 132 are provided in this order and which is formed over the base insulating film; a source electrode layer 140 and a drain electrode layer 150, each in contact with part of the stack; a third oxide semiconductor layer 133 which is in contact with part of each of the base insulating film 120, the stack, the source electrode layer 140, and the drain electrode layer 150; a gate insulating film 160 formed over the third oxide semiconductor layer; a gate electrode layer 170 formed over the gate insulating film; and an insulating layer 180 formed over the source electrode layer 140, the drain electrode layer 150, and the gate electrode layer 170.

Here, the first oxide semiconductor layer 131 preferably includes a crystalline layer in which c-axes are aligned in a direction perpendicular to a surface of the base insulating film 120. The second oxide semiconductor layer 132 preferably includes a crystalline layer in which c-axes are aligned in a direction perpendicular to a top surface of the first oxide semiconductor layer 131.

Further, the third oxide semiconductor layer 133 is formed to have a first layer in contact with the stack and a second layer over the first layer. The first layer includes a microcrystalline layer, and the second layer includes a crystalline layer in which c-axes are aligned in a direction perpendicular to a surface of the first layer.

Further, an insulating layer 185 formed using an oxide may be formed over the insulating layer 180. The insulating layer 185 may be provided as needed and another insulating layer may be further provided thereover. The first oxide semiconductor layer 131, the second oxide semiconductor layer 132, and the third oxide semiconductor layer 133 are collectively referred to as an oxide semiconductor layer 130.

Note that functions of a "source" and a "drain" of a transistor are sometimes replaced with each other when a transistor of opposite polarity is used or when the direction of current flowing is changed in circuit operation, for example. Thus, the terms "source" and "drain" can be used to denote the drain and the source, respectively, in this specification.

In addition, in the source electrode layer 140 or the drain electrode layer 150 overlapping with the oxide semiconductor layers (the first oxide semiconductor layer 131 and the second oxide semiconductor layer 132) of the transistor of one embodiment of the present invention, the distance ($\Delta W$) between one edge portion of the oxide semiconductor layer and one edge portion of the source electrode layer 140 or the drain electrode layer 150, which is shown in the top view of FIG. 1A, is set shorter than or equal to 50 nm, preferably shorter than or equal to 25 nm. When $\Delta W$ is set small, oxygen contained in the base insulating film 120 can be prevented from being diffused to a metal material, which is the component of the source electrode layer 140 and the drain electrode layer 150. Thus, unnecessary release of oxygen, in particular, excess oxygen, contained in the base insulating film 120, can be prevented. As a result, oxygen can be efficiently supplied from the base insulating film 120 to the oxide semiconductor layer.

Then, the components of the transistor 100 of one embodiment of the present invention will be described in detail.

The substrate 110 is not limited to a simple supporting substrate, and may be a substrate where another device such as a transistor is formed. In that case, at least one of the gate electrode layer 170, the source electrode layer 140, and the drain electrode layer 150 of the transistor 100 may be electrically connected to the above device.

The base insulating film 120 can have a function of supplying oxygen to the oxide semiconductor layer 130 as well as a function of preventing diffusion of impurities from the substrate 110. For this reason, the base insulating film 120 is preferably an insulating film containing oxygen and further preferably, the base insulating film 120 is an insulating film containing oxygen in which the oxygen content is higher than that in the stoichiometric composition. In the case where the substrate 110 is provided with another device as described above, the base insulating film 120 also has a function as an interlayer insulating film. In that case, the base insulating film 120 is preferably subjected to planarization treatment such as chemical mechanical polishing (CMP) treatment so as to have a flat surface.

Further, in a region where a channel of the transistor 100 is formed, the oxide semiconductor layer 130 has a structure in which the first oxide semiconductor layer 131, the second oxide semiconductor layer 132, and the third oxide semiconductor layer 133 are stacked in this order from the substrate 110 side. In addition, as illustrated in the cross-sectional view in a channel width direction in FIG. 1C, in the channel formation region, the third oxide semiconductor layer 133 is formed to cover a side surface, the top surface, and the opposite side surface of the stack including the first oxide semiconductor layer 131 and the second oxide semiconductor layer 132. This means that, in the channel formation region, the second oxide semiconductor layer 132 is surrounded by the first oxide semiconductor layer 131 and the third oxide semiconductor layer 133.

Here, for the second oxide semiconductor layer 132, for example, an oxide semiconductor whose electron affinity (an energy difference between a vacuum level and the conduction band minimum) is higher than those of the first oxide semiconductor layer 131 and the third oxide semiconductor layer 133 is used. The electron affinity can be obtained by subtracting an energy difference between the conduction band minimum and the valence band maximum (what is called an energy gap) from an energy difference between the vacuum level and the valence band maximum (what is called an ionization potential).

The first oxide semiconductor layer 131 and the third oxide semiconductor layer 133 each contain one or more kinds of metal elements forming the second oxide semiconductor layer 132. For example, the first oxide semiconductor layer 131 and the third oxide semiconductor layer 133 are preferably formed using an oxide semiconductor whose conduction band minimum is closer to a vacuum level than that of the second oxide semiconductor layer 132 is. Further, the energy difference of the conduction band minimum between the second oxide semiconductor layer 132 and the first oxide semiconductor layer 131 and the energy difference of the conduction band minimum between the second oxide semiconductor layer 132 and the third oxide semiconductor layer 133 are each preferably greater than or equal to 0.05 eV, 0.07 eV, 0.1 eV, or 0.15 eV and smaller than or equal to 2 eV, 1 eV, 0.5 eV, or 0.4 eV.

In such a structure, when an electric field is applied to the gate electrode layer 170, a channel is formed in the second oxide semiconductor layer 132 whose conduction band minimum is the lowest in the oxide semiconductor layer 130. In other words, the third oxide semiconductor layer 133 is formed between the second oxide semiconductor layer 132 and the gate insulating film 160, whereby a structure in which the channel of the transistor is not in contact with the gate insulating film is obtained.

Further, since the first oxide semiconductor layer 131 contains one or more metal elements contained in the second oxide semiconductor layer 132, an interface state is less likely to be formed at the interface of the second oxide semiconductor layer 132 with the first oxide semiconductor layer 131 than at the interface with the base insulating film 120 on the assumption that the second oxide semiconductor layer 132 is in contact with the base insulating film 120. The interface state sometimes forms a channel, leading to a change in the threshold voltage of the transistor. Thus, with the first oxide semiconductor layer 131, variations in the electrical characteristics of the transistor, such as a threshold voltage, can be reduced. Further, the reliability of the transistor can be improved.

Furthermore, since the third oxide semiconductor layer 133 contains one or more metal elements contained in the second oxide semiconductor layer 132, scattering of carriers is less likely to occur at the interface of the second oxide semiconductor layer 132 with the third oxide semiconductor layer 133 than at the interface with the gate insulating film 160 on the assumption that the second oxide semiconductor layer 132 is in contact with the gate insulating film 160. Thus, with the third oxide semiconductor layer 133, the field-effect mobility of the transistor can be increased.

When each of the first oxide semiconductor layer 131, the second oxide semiconductor layer 132, and the third oxide semiconductor layer 133 is an In-M-Zn oxide layer containing at least indium, zinc, and M (M is a metal such as Al, Ti, Ga, Ge, Y, Zr, Sn, La, Ce, or Hf), the atomic ratio of M to In or Zn in the first oxide semiconductor layer 131 and the third oxide semiconductor layer 133 is preferably higher than that in the second oxide semiconductor layer 132. Specifically, the atomic ratio of M to In or Zn in the first oxide semiconductor layer 131 and the third oxide semiconductor layer 133 is 1.5 times or more, preferably 2 times or more, further preferably 3 times or more as much as that in the second oxide semiconductor layer 132. The metal M is more strongly bonded to oxygen than In or Zn is and thus has a function of suppressing generation of an oxygen vacancy in an oxide semiconductor layer. That is, an oxygen vacancy is less likely to be generated in the first oxide semiconductor layer 131 and the third oxide semiconductor layer 133 than in the second oxide semiconductor layer 132.

Note that when each of the first oxide semiconductor layer 131, the second oxide semiconductor layer 132, and the third oxide semiconductor layer 133 is an In-M-Zn oxide layer containing at least indium, zinc, and M (M is a metal such as Al, Ti, Ga, Ge, Y, Zr, Sn, La, Ce, or Hf), and the first oxide semiconductor layer 131 has an atomic ratio of In to M and Zn which is $x_1:y_1:z_1$, the second oxide semiconductor layer 132 has an atomic ratio of In to M and Zn which is $x_2:y_2:z_2$, and the third oxide semiconductor layer 133 has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or more as large as $y_2/x_2$. At this time, when $y_2$ is greater than or equal to $x_2$ in the second oxide semiconductor layer 132, the transistor can have stable electrical characteristics. However, when $y_2$ is 3 times or more as large as $x_2$, the field-effect mobility of the transistor is reduced; accordingly, $y_2$ is preferably less than 3 times $x_2$.

Note that in this specification, an atomic ratio used for describing the composition of an oxide semiconductor layer can be also used as the atomic ratio of a base material. In the case where an oxide semiconductor layer is deposited by a sputtering method using an oxide semiconductor material as a target, the composition of the oxide semiconductor layer might be different from that of the target, which is a base material, depending on the kind or a ratio of a sputtering gas, the density of the target, or deposition conditions. Thus, in this specification, an atomic ratio used for describing the composition of an oxide semiconductor layer is also used as the atomic ratio of a base material. For example, in the case where a sputtering method is used for deposition, an In—Ga—Zn oxide film whose atomic ratio of In to Ga and Zn is 1:1:1 can be also understood as an In—Ga—Zn oxide film formed using an In—Ga—Zn oxide material whose atomic ratio of In to Ga and Zn is 1:1:1 as a target.

Further, in the case where Zn and O are not taken into consideration, the proportion of In and the proportion of M in each of the first oxide semiconductor layer 131 and the third oxide semiconductor layer 133 are preferably less than 50 atomic % and greater than or equal to 50 atomic %, respectively, and further preferably less than 25 atomic % and greater than or equal to 75 atomic %, respectively. In addition, in the case where Zn and O are not taken into consideration, the proportion of In and the proportion of M in the second oxide semiconductor layer 132 are preferably greater than or equal to 25 atomic % and less than 75 atomic %, respectively, and further preferably greater than or equal to 34 atomic % and less than 66 atomic %, respectively.

The thicknesses of the first oxide semiconductor layer 131 and the third oxide semiconductor layer 133 are each greater than or equal to 1 nm and less than or equal to 100 nm, preferably greater than or equal to 3 nm and less than or equal to 50 nm. The thickness of the second oxide semiconductor layer 132 is greater than or equal to 1 nm and less than or equal to 200 nm, preferably greater than or equal to 3 nm and less than or equal to 100 nm, further preferably greater than or equal to 3 nm and less than or equal to 50 nm.

For the first oxide semiconductor layer 131, the second oxide semiconductor layer 132, and the third oxide semiconductor layer 133, an oxide semiconductor containing indium, zinc, and gallium can be used, for example. Note that the second oxide semiconductor layer 132 preferably contains indium because carrier mobility can be increased.

Accordingly, with the oxide semiconductor layer 130 having a stacked-layer structure including the first oxide semiconductor layer 131, the second oxide semiconductor layer 132, and the third oxide semiconductor layer 133, a channel can be formed in the second oxide semiconductor layer 132; thus, the transistor can have a high field-effect mobility and stable electrical characteristics.

In a band structure, the conduction band minimums of the first oxide semiconductor layer 131, the second oxide semiconductor layer 132, and the third oxide semiconductor layer 133 are continuous. This can be understood also from the fact that the compositions of the first oxide semiconductor layer 131, the second oxide semiconductor layer 132, and the third oxide semiconductor layer 133 are close to one another and oxygen is easily diffused among the first oxide semiconductor layer 131, the second oxide semiconductor layer 132, and the third oxide semiconductor layer 133. Thus, the first oxide semiconductor layer 131, the second oxide semiconductor layer 132, and the third oxide semiconductor layer 133 have a continuous physical property although they have different compositions and form a stack. In the drawings, interfaces between the oxide semiconductor layers of the stack are indicated by dotted lines.

The oxide semiconductor layer 130 in which layers containing the same main components are stacked is formed to have not only a simple stacked-layer structure of the layers but also a continuous energy band (here, in particular, a well structure having a U shape in which the conduction band minimums are continuous). In other words, the stacked-layer structure is formed such that there exists no impurity that forms a defect level such as a trap center or a recombination center at each interface. If impurities exist between the stacked oxide semiconductor layers, the continuity of the energy band is lost and carriers disappear by a trap or recombination at the interface.

An In—Ga—Zn oxide whose atomic ratio of In to Ga and Zn is 1:3:2, 1:3:3, 1:3:4, 1:3:6, 1:6:4, or 1:9:6 can be used for the first oxide semiconductor layer 131 and the third oxide semiconductor layer 133 and an In—Ga—Zn oxide whose atomic ratio of In to Ga and Zn is 1:1:1, 5:5:6, 3:1:2, or the like can be used for the second oxide semiconductor layer 132, for example.

The second oxide semiconductor layer 132 of the oxide semiconductor layer 130 serves as a well, so that a channel is formed in the second oxide semiconductor layer 132 in a transistor including the oxide semiconductor layer 130. Note that since the conduction band minimums are continuous, the oxide semiconductor layer 130 can also be referred to as a U-shaped well. Further, a channel formed to have such a structure can also be referred to as a buried channel.

Note that trap levels due to impurities or defects might be formed in the vicinity of the interface between an insulating film such as a silicon oxide film and each of the first oxide semiconductor layer 131 and the third oxide semiconductor layer 133. The second oxide semiconductor layer 132 can be distanced away from the trap levels owing to existence of the first oxide semiconductor layer 131 and the third oxide semiconductor layer 133.

However, when the energy differences between the conduction band minimum of the second oxide semiconductor layer 132 and the conduction band minimum of each of the first oxide semiconductor layer 131 and the third oxide semiconductor layer 133 are small, an electron in the second oxide semiconductor layer 132 might reach the trap level by passing over the energy differences. When the electron is trapped in the trap level, a negative fixed charge is generated at the interface with the insulating film, whereby the threshold voltage of the transistor is shifted in the positive direction.

Thus, to reduce fluctuations in the threshold voltage of the transistor, energy differences of at least certain values between the conduction band minimum of the second oxide semiconductor layer 132 and the conduction band minimum of each of the first oxide semiconductor layer 131 and the third oxide semiconductor layer 133 are necessary. Each of the energy differences is preferably greater than or equal to 0.1 eV, further preferably greater than or equal to 0.15 eV.

Note that each of the first oxide semiconductor layer 131, the second oxide semiconductor layer 132, and the third oxide semiconductor layer 133 preferably includes a crystalline layer in which c-axes are aligned. A film containing the crystalline layer can provide a transistor with stable electrical characteristics.

In the case where an In—Ga—Zn oxide is used for the oxide semiconductor layer 130, it is preferable that the third oxide semiconductor layer 133 contain less In than the second oxide semiconductor layer 132 so that diffusion of In to the gate insulating film is prevented.

The above-described buried channel is formed in the transistor of one embodiment of the present invention. In addition, as in the transistor illustrated in FIG. 2, the third oxide semiconductor layer 133 includes a microcrystalline layer 133a in contact with the base insulating film 120 and the stack including the first oxide semiconductor layer 131 and the second oxide semiconductor layer 132, and a crystalline layer 133b in which c-axes are aligned in a direction perpendicular to a surface of the microcrystalline layer.

Figure 2:
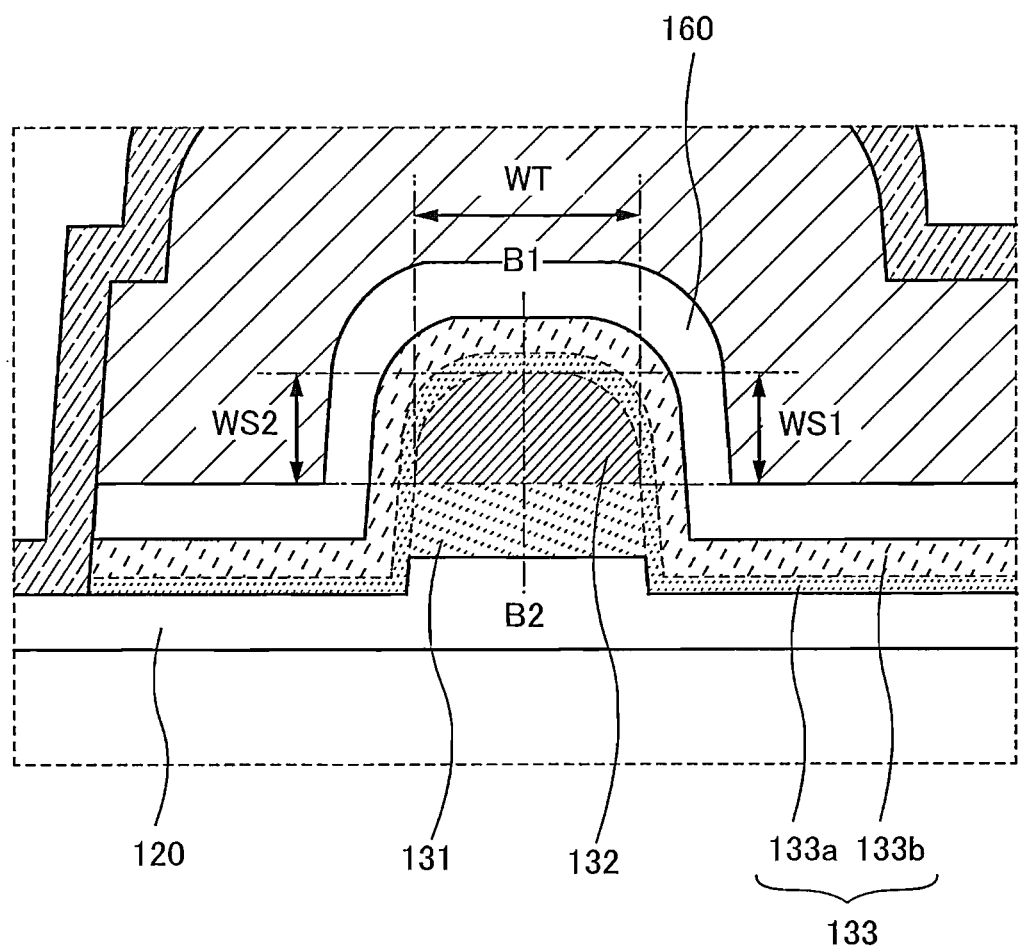
FIG. 2 is a cross-sectional view of a transistor.
Figure 3:
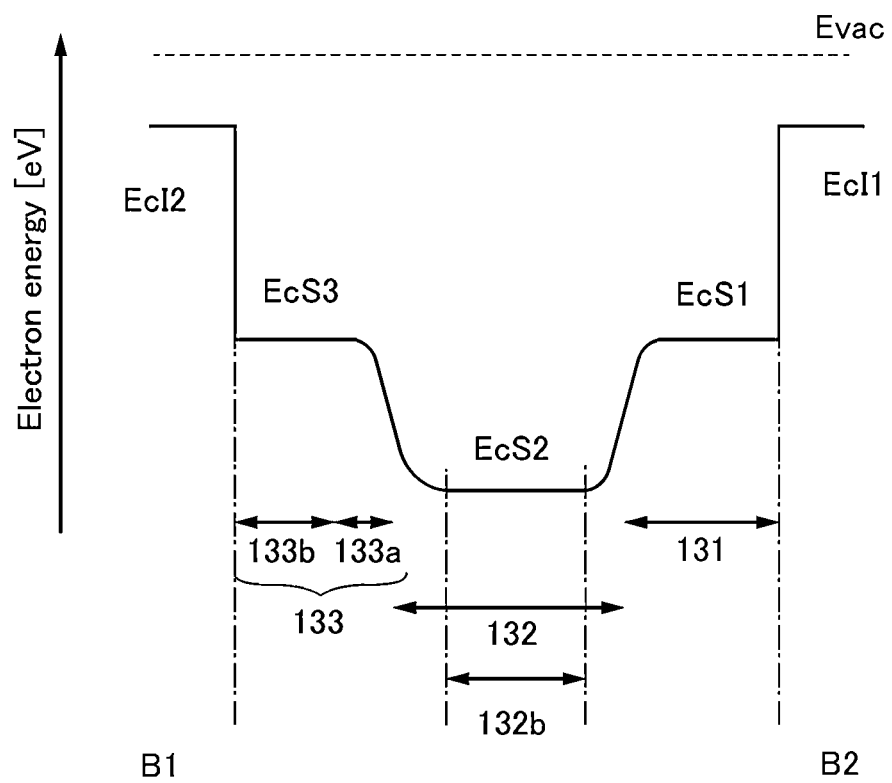
FIG. 3 illustrates a band structure of oxide semiconductor layers.

FIG. 3 illustrates the details of the band structure of the oxide semiconductor layers (in the B1-B2 direction in FIG. 2) having such a structure. Here, Evac represents energy of the vacuum level, EcI1 and EcI2 each represent the conduction band minimum of the silicon oxide film, EcS1 represents the conduction band minimum of the first oxide semiconductor layer 131, EcS2 represents the conduction band minimum of the second oxide semiconductor layer 132, and EcS3 represents the conduction band minimum of the third oxide semiconductor layer 133.

Energy does not change suddenly between EcS1 and EcS2 and between EcS3 and EcS2, and gradually starts and stops changing.

This is because the constituents of the oxide semiconductor layers are diffused interactively between the first oxide semiconductor layer 131 and the second oxide semiconductor layer 132 and between the third oxide semiconductor layer 133 and the second oxide semiconductor layer 132, which leads to formation of a region whose composition is intermediate between the compositions of the first oxide semiconductor layer 131 and the second oxide semiconductor layer 132 or a region whose composition is intermediate between the compositions of the third oxide semiconductor layer 133 and the second oxide semiconductor layer 132.

Thus, as illustrated in FIG. 3, a channel formed in the second oxide semiconductor layer 132 is formed in a region 132b which is positioned at an inner side than the interface between the third oxide semiconductor layer 133 and the second oxide semiconductor layer 132 and the interface between the first oxide semiconductor layer 131 and the second oxide semiconductor layer 132. With such a structure, a carrier can be prevented from being trapped or recombined even when a defect or an impurity exists at either one of the interfaces.

In the third oxide semiconductor layer 133, a region in contact with a stack including the first oxide semiconductor layer 131 and the second oxide semiconductor layer 132 includes the microcrystalline layer 133a. The density of the microcrystalline layer is lower than that of the crystalline layer 133b, which is formed over the microcrystalline layer; thus, the constituents of the second oxide semiconductor layer 132 are easily diffused to the third oxide semiconductor layer 133 side. As a result, the region whose composition is intermediate between the compositions of the third oxide semiconductor layer 133 and the second oxide semiconductor layer 132 becomes large. Thus, the channel formed in the second oxide semiconductor layer 132 is positioned further apart from the interface between the third oxide semiconductor layer 133 and the second oxide semiconductor layer 132 toward the center of the second oxide semiconductor layer 132, and a malfunction which occurs when a defect or an impurity exists at the interface can be avoided more effectively.

In the case where the first oxide semiconductor layer 131 and the second oxide semiconductor layer 132 each include a crystalline layer in which c-axes are aligned, oxygen is relatively likely to be diffused since the density of the microcrystalline layer 133a is lower than that of the crystalline layer. Accordingly, oxygen can be efficiently supplied from the base insulating film 120 to the second oxide semiconductor layer 132 to be a channel with the use of the microcrystalline layer 133a as a path, and an oxygen vacancy can be filled with oxygen.

Further, in the crystalline layer 133b in the third oxide semiconductor layer 133, c-axes are aligned in the direction perpendicular to the surface of the microcrystalline layer 133a. Thus, when the second oxide semiconductor layer 132 is formed to have a curved surface, a channel region in the second oxide semiconductor layer 132 can be densely covered by crystals whose c-axes are aligned.

Figure 4A:
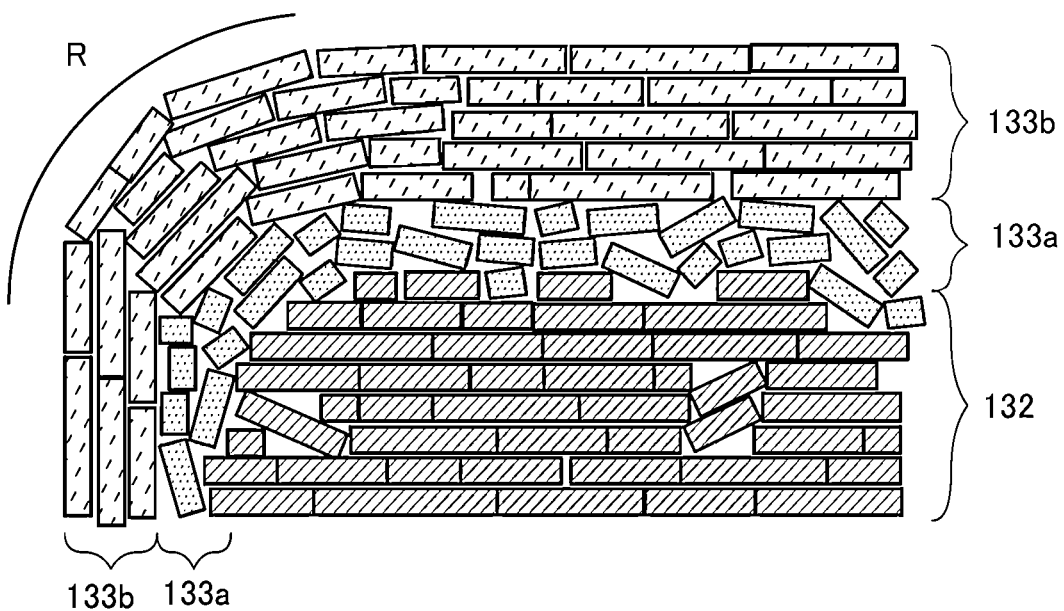
FIGS. 4A and 4B each illustrate a crystal structure of part of a stack including oxide semiconductor layers.

FIG. 4A is a cross-sectional view in the channel width direction of the transistor, which schematically illustrates part of a crystal structure of a stack including the second oxide semiconductor layer 132 formed to have a curved surface, the microcrystalline layer 133a covering the second oxide semiconductor layer, and the crystalline layer 133b formed over the microcrystalline layer. Here, the second oxide semiconductor layer 132 is a crystalline layer in which c-axes are aligned in a direction perpendicular to a surface of the first oxide semiconductor layer 131 (not illustrated).

When the second oxide semiconductor layer 132 is formed to have a curved surface as illustrated in FIG. 4A, the third oxide semiconductor layer 133 can be formed to have the dense crystalline layer 133b in which c-axes are aligned in the direction perpendicular to the curved surface, with the microcrystalline layer 133a is provided between the second oxide semiconductor layer 132 and the dense crystalline layer 133b. Such a structure can improve an effect of suppressing release of oxygen from the second oxide semiconductor layer 132 or an effect of confining oxygen released from the base insulating film 120 by the third oxide semiconductor layer 133; thus, an oxygen vacancy in the second oxide semiconductor layer 132 can be efficiently filled with oxygen.

Figure 4B:
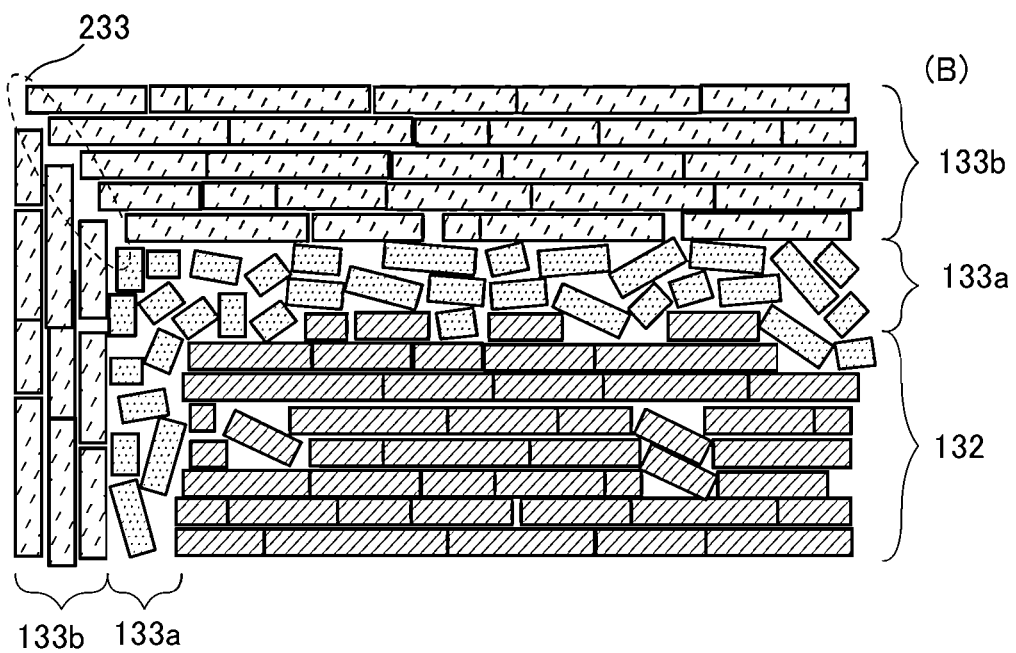

Note that in the case where the second oxide semiconductor layer 132 is formed not to have a curved surface as illustrated in FIG. 4B, a region 233 in which crystals are sparse is formed at an intersection of the crystalline layer 133b formed over the top surface of the second oxide semiconductor layer 132 and the crystalline layer 133b that is formed to face a side surface of the second oxide semiconductor layer 132, in the third oxide semiconductor layer 133. Thus, oxygen contained in the second oxide semiconductor layer 132 and oxygen supplied from the base insulating film 120 to the second oxide semiconductor layer 132 are likely to be released through the region 233, in which case an oxygen vacancy in the second oxide semiconductor layer 132 cannot be efficiently filled with oxygen.

Note that stable electrical characteristics can be effectively imparted to a transistor in which an oxide semiconductor layer serves as a channel by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1 \times 10^{17}/cm^3$, preferably lower than $1 \times 10^{15}/cm^3$, further preferably lower than $1 \times 10^{13}/cm^3$.

Further, in the oxide semiconductor layer, hydrogen, nitrogen, carbon, silicon, and a metal element other than main components are impurities. For example, hydrogen and nitrogen form donor levels to increase the carrier density, and silicon forms impurity levels in the oxide semiconductor layer. The impurity levels serve as traps and might cause the electrical characteristics of the transistor to deteriorate. Thus, it is preferable to reduce the concentration of the impurities in the first oxide semiconductor layer 131, the second oxide semiconductor layer 132, and the third oxide semiconductor layer 133, and at interfaces between the layers.

In order to make the oxide semiconductor layer intrinsic or substantially intrinsic, in SIMS (secondary ion mass spectrometry), for example, the concentration of silicon at a certain depth of the oxide semiconductor layer or in a region of the oxide semiconductor layer is preferably lower than $1 \times 10^{19}$ atoms/$cm^3$, further preferably lower than $5 \times 10^{18}$ atoms/$cm^3$, still further preferably lower than $1 \times 10^{18}$ atoms/$cm^3$. Further, the concentration of hydrogen at a certain depth of the oxide semiconductor layer or in a region of the oxide semiconductor layer is preferably lower than or equal to $2 \times 10^{20}$ atoms/$cm^3$, further preferably lower than or equal to $5 \times 10^{19}$ atoms/$cm^3$, still further preferably lower than or equal to $1 \times 10^{19}$ atoms/$cm^3$, yet still further preferably lower than or equal to $5 \times 10^{18}$ atoms/$cm^3$. Further, the concentration of nitrogen at a certain depth of the oxide semiconductor layer or in a region of the oxide semiconductor layer is preferably lower than $5 \times 10^{19}$ atoms/$cm^3$, further preferably lower than or equal to $5 \times 10^{18}$ atoms/$cm^3$, still further preferably lower than or equal to $1 \times 10^{18}$ atoms/$cm^3$, yet still further preferably lower than or equal to $5 \times 10^{17}$ atoms/$cm^3$.

In the case where the oxide semiconductor layer includes crystals, high concentration of silicon or carbon might reduce the crystallinity of the oxide semiconductor layer. In order not to reduce the crystallinity of the oxide semiconductor layer, for example, the concentration of silicon at a certain depth of the oxide semiconductor layer or in a region of the oxide semiconductor layer may be lower than $1 \times 10^{19}$ atoms/$cm^3$, preferably lower than $5 \times 10^{18}$ atoms/$cm^3$, further preferably lower than $1 \times 10^{18}$ atoms/$cm^3$. Further, the concentration of carbon at a certain depth of the oxide semiconductor layer or in a region of the oxide semiconductor layer may be lower than $1 \times 10^{19}$ atoms/$cm^3$, preferably lower than $5 \times 10^{18}$ atoms/$cm^3$, further preferably lower than $1 \times 10^{18}$ atoms/$cm^3$, for example.

A transistor in which the above-described highly purified oxide semiconductor layer is used for a channel formation region has an extremely low off-state current. In the case where the voltage between a source and a drain is set to approximately 0.1 V, 5 V, or 10 V, for example, the off-state current standardized on the channel width of the transistor can be as low as several yoctoamperes per micrometer to several zeptoamperes per micrometer.

Note that as the gate insulating film of the transistor, an insulating film containing silicon is used in many cases; thus, it is preferable that, as in the transistor of one embodiment of the present invention, a region of the oxide semiconductor layer, which serves as a channel, be not in contact with the gate insulating film for the above-described reason. In the case where a channel is formed at the interface between the gate insulating film and the oxide semiconductor layer, scattering of carriers occurs at the interface, whereby the field-effect mobility of the transistor is reduced in some cases. Also from the view of the above, it is preferable that the region of the oxide semiconductor layer, which serves as a channel, be separated from the gate insulating film.

For the source electrode layer 140 and the drain electrode layer 150, a conductive material which is easily bonded to oxygen is preferably used. For example, Al, Cr, Cu, Ta, Ti, Mo, or W can be used. Among the materials, in particular, it is preferable to use Ti which is easily bonded to oxygen or to use W with a high melting point, which allows subsequent process temperatures to be relatively high. Note that the conductive material which is easily bonded to oxygen includes, in its category, a material to which oxygen is easily diffused.

When the conductive material which is easily bonded to oxygen is in contact with an oxide semiconductor layer, a phenomenon occurs in which oxygen in the oxide semiconductor layer is diffused to the conductive material which is easily bonded to oxygen. The phenomenon noticeably occurs when the temperature is high. Since the manufacturing process of the transistor involves a heat treatment step, the above phenomenon causes generation of oxygen vacancies in the vicinity of a region which is in the oxide semiconductor layer and is in contact with the source electrode layer or the drain electrode layer. The oxygen vacancies bond to hydrogen slightly contained in the layer, whereby the region is changed to an n-type region. Thus, the n-type region can serve as a source or a drain of the transistor.

Figure 5:
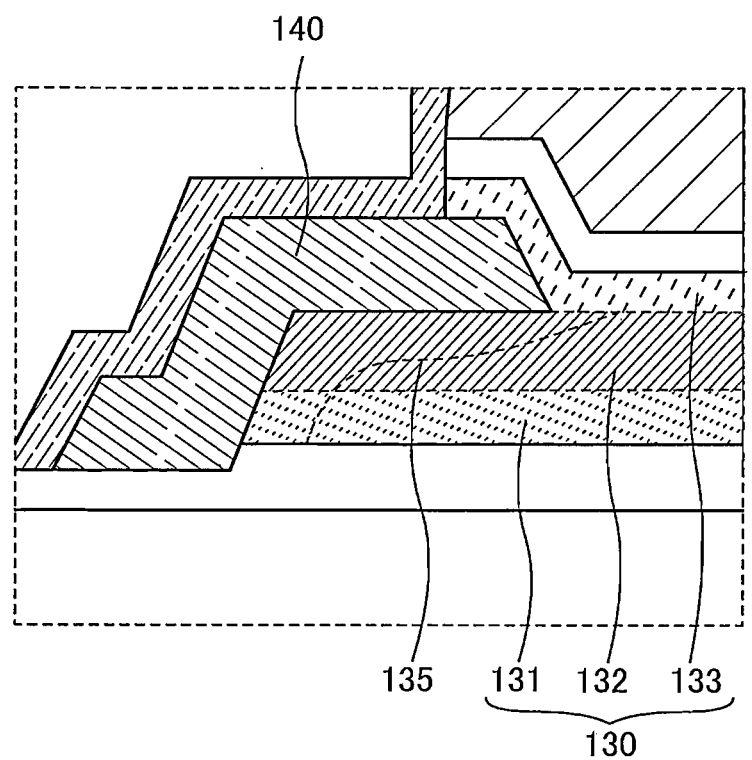
FIG. 5 is an enlarged cross-sectional view of a transistor.

The n-type region is illustrated in an enlarged cross-sectional view of the transistor (showing part of a cross section in the channel length direction, which is near the source electrode layer 140) in FIG. 5. A boundary 135 indicated by a dotted line in the first oxide semiconductor layer 131 and the second oxide semiconductor layer 132 is a boundary between an intrinsic semiconductor region and an n-type semiconductor region. In the first oxide semiconductor layer 131 and the second oxide semiconductor layer 132, a region near the source electrode layer 140 becomes an n-type region. The boundary 135 is schematically illustrated here, but actually, the boundary is not clearly seen in some cases. Although FIG. 5 shows that part of the boundary 135 extends in the lateral direction in the second oxide semiconductor layer 132, a region in the first oxide semiconductor layer 131 and the second oxide semiconductor layer 132, which is sandwiched between the source electrode layer 140 and the base insulating film 120, becomes n-type entirely in the thickness direction, in some cases.

In the case of forming a transistor with an extremely short channel length, an n-type region which is formed by the generation of oxygen vacancies might extend in the channel length direction of the transistor. In that case, the electrical characteristics of the transistor change; for example, the threshold voltage is shifted, or on and off states of the transistor cannot be controlled with the gate voltage (in which case the transistor is turned on). Accordingly, when a transistor with an extremely short channel length is formed, it is not always preferable that a conductive material easily bonded to oxygen be used for a source electrode layer and a drain electrode layer.

In such a case, a conductive material which is less likely to be bonded to oxygen than the above material can be used for the source electrode layer 140 and the drain electrode layer 150. As the conductive material which is not easily bonded to oxygen, for example, a material containing tantalum nitride, titanium nitride, gold, platinum, palladium, or ruthenium or the like can be used. Note that in the case where the conductive material is in contact with the second oxide semiconductor layer 132, the source electrode layer 140 and the drain electrode layer 150 may each have a structure in which the conductive material which is not easily bonded to oxygen and the above-described conductive material that is easily bonded to oxygen are stacked.

The gate insulating film 160 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 160 may be a stack including any of the above materials.

For the gate electrode layer 170, a conductive film formed using Al, Ti, Cr, Co, Ni, Cu, Y, Zr, Mo, Ru, Ag, Ta, W, or the like can be used. The gate electrode layer may be a stack including any of the above materials. Alternatively, a conductive film containing nitrogen may be used for the gate electrode layer.

The insulating layer 180 is preferably formed over the gate insulating film 160 and the gate electrode layer 170. The insulating layer is preferably formed using aluminum oxide. The aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture, which cause variations in the electrical characteristics of the transistor, into the oxide semiconductor layer 130, preventing release of oxygen, which is a main component of the oxide semiconductor layer 130, from the oxide semiconductor layer, and preventing unnecessary release of oxygen from the base insulating film 120. Further, oxygen contained in the aluminum oxide film can be diffused in the oxide semiconductor layer.

Further, the insulating layer 185 is preferably formed over the insulating layer 180. The insulating layer 185 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 185 may be a stack including any of the above materials.

Here, the insulating layer 185 preferably contains excess oxygen. An insulating layer containing excess oxygen refers to an insulating layer from which oxygen can be released by heat treatment or the like. The insulating layer containing excess oxygen is, for example, a film in which the amount of released oxygen when converted into oxygen atoms is $1.0 \times 10^{19}$ atoms/cm$^3$ or more in thermal desorption spectroscopy analysis. In the thermal desorption spectroscopy analysis, heat treatment is performed at a surface temperature of higher than or equal to 100° C. and lower than or equal to 700° C., preferably higher than or equal to 100° C. and lower than or equal to 500° C. Oxygen released from the insulating layer can be diffused to the channel formation region in the oxide semiconductor layer 130 through the gate insulating film 160, so that oxygen vacancies formed in the channel formation region can be filled with the oxygen. In this manner, the electrical characteristics of the transistor can be stable.

High integration of a semiconductor device requires miniaturization of a transistor. However, it is known that miniaturization of a transistor causes deterioration of the electrical characteristics of the transistor. In particular, a reduction in on-state current, which is directly caused by a decrease in channel width, is significant.

However, in the transistor of one embodiment of the present invention, as described above, the third oxide semiconductor layer 133 is formed so as to cover a region where a channel is formed in the second oxide semiconductor layer 132, and the channel formation layer and the gate insulating film are not in contact with each other. Accordingly, scattering of carriers at the interface between the channel formation layer and the gate insulating film can be reduced and the field-effect mobility of the transistor can be increased.

In addition, the electrical characteristics of the transistor of one embodiment of the present invention can be particularly improved with a structure as illustrated in a cross-sectional view in the channel width direction in FIG. 2, in which the length of the top surface ($W_T$) of the second oxide semiconductor layer 132 in the channel width direction is as small as its thickness.

In the case where $W_T$ is small as in a transistor illustrated in FIG. 2, for example, an electric field from the gate electrode layer 170 to the side surface of the second oxide semiconductor layer 132 is applied to the entire second oxide semiconductor layer 132; thus, a channel is formed equally in the side and top surfaces of the second oxide semiconductor layer 132.

In the case of a transistor in which $W_T$ is small, the channel width can be defined as the sum of $W_T$ and the lengths of the side surfaces ($W_{S1}$ and $W_{S2}$) of the second oxide semiconductor layer 132 in the channel width direction (i.e., $W_T+W_{S1}+W_{S2}$), and on-state current flows in the transistor in accordance with the channel width. In the case where $W_T$ is extremely small, current flows in the entire second oxide semiconductor layer 132.

That is, the transistor of one embodiment of the present invention in which $W_T$ is small can have higher on-state current than the conventional transistor owing to both of an effect of suppressing scattering of carriers and an effect of extending the channel width.

Note that in order to efficiently increase the on-state current of the transistor when $W_{S1}$ and $W_{S2}$ are represented by $W_S$ ($W_{S1}=W_{S2}=W_S$), a relation $0.3W_S \leq W_T \leq 3W_S$ ($W_T$ is greater than or equal to $0.3W_S$ and less than or equal to $3W_S$) is satisfied. Further, $W_T/W_S$ is preferably greater than or equal to 0.5 and less than or equal to 1.5, further preferably greater than or equal to 0.7 and less than or equal to 1.3. In the case where $W_T/W_S>3$, the S value and the off-state current might be increased.

As described above, with the transistor of one embodiment of the present invention, sufficiently high on-state current can be obtained even when the transistor is miniaturized.

In the transistor of one embodiment of the present invention, the second oxide semiconductor layer 132 is formed over the first oxide semiconductor layer 131, so that an interface state is less likely to be formed. In addition, impurities do not enter the second oxide semiconductor layer 132 from above and below because the second oxide semiconductor layer 132 is an intermediate layer in a three-layer structure. Since the second oxide semiconductor layer 132 is surrounded by the first oxide semiconductor layer 131 and the third oxide semiconductor layer 133, not only the on-state current of the transistor can be increased but the threshold voltage can be stabilized and the S value can be reduced. Thus, Icut (current when gate voltage VG is 0 V) can be reduced and power consumption of the semiconductor device can be reduced. Further, the threshold voltage of the transistor becomes stable; thus, long-term reliability of the semiconductor device can be improved.

Figure 6:
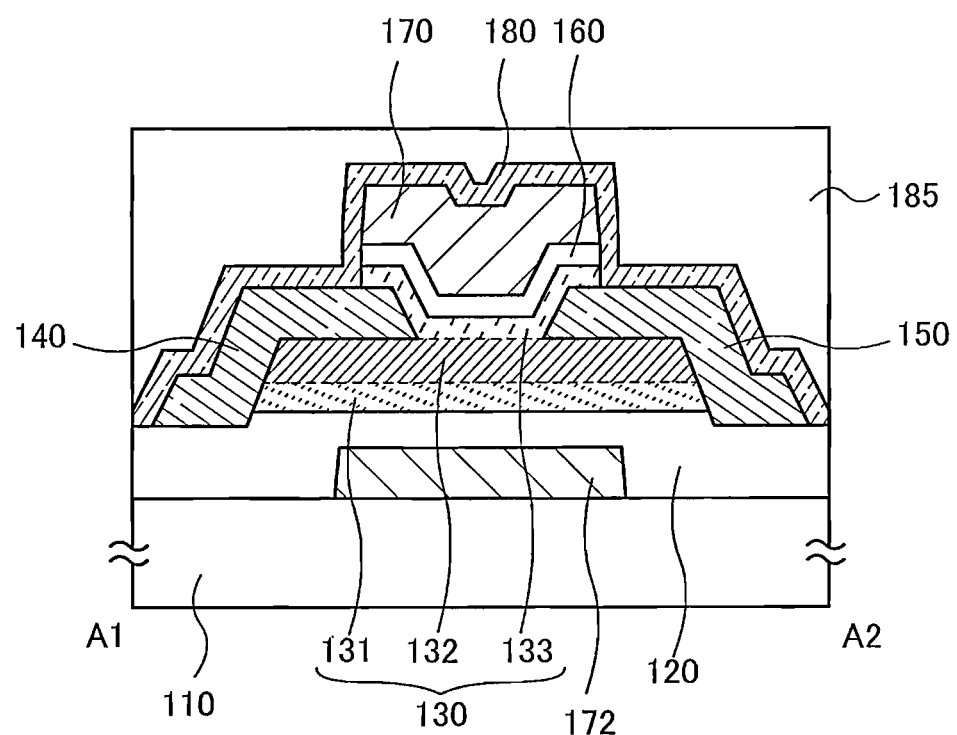
FIG. 6 is a cross-sectional view of a transistor.

The transistor of one embodiment of the present invention may include a conductive film 172 between the oxide semiconductor layer 130 and the substrate 110 as illustrated in FIG. 6. When the conductive film is used as a second gate electrode, the on-state current can be further increased and the threshold voltage can be controlled. In order to increase the on-state current, for example, the gate electrode layer 170 and the conductive film 172 are set to have the same potential, and the transistor is driven as a dual-gate transistor. Further, to control the threshold voltage, a fixed potential, which is different from a potential of the gate electrode layer 170, is supplied to the conductive film 172.

This embodiment can be combined as appropriate with any of the other embodiments and an example in this specification.

Embodiment 2

In this embodiment, a method for forming the transistor 100, which is described in Embodiment 1 with reference to FIGS. 1A to 1C, is described with reference to FIGS. 7A to 7C and FIGS. 8A to 8C.

For the substrate 110, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like can be used. Further alternatively, any of these substrates further provided with a semiconductor element can be used.

The base insulating film 120 can be formed by a plasma CVD method, a sputtering method, or the like using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a film in which any of the above materials are mixed. Alternatively, a stack including any of the above materials may be used, and at least an upper layer of the base insulating film 120 which is in contact with the oxide semiconductor layer 130 is preferably formed using a material containing excess oxygen that might serve as a supply source of oxygen to the oxide semiconductor layer 130.

Oxygen may be added to the base insulating film 120 by an ion implantation method, an ion doping method, a plasma immersion ion implantation method, or the like. Adding oxygen enables the base insulating film 120 to supply oxygen much easily to the oxide semiconductor layer 130.

In the case where a surface of the substrate 110 is made of an insulator and there is no influence of impurity diffusion to the oxide semiconductor layer 130 to be formed later, the base insulating film 120 is not necessarily provided.

Figure 7A:
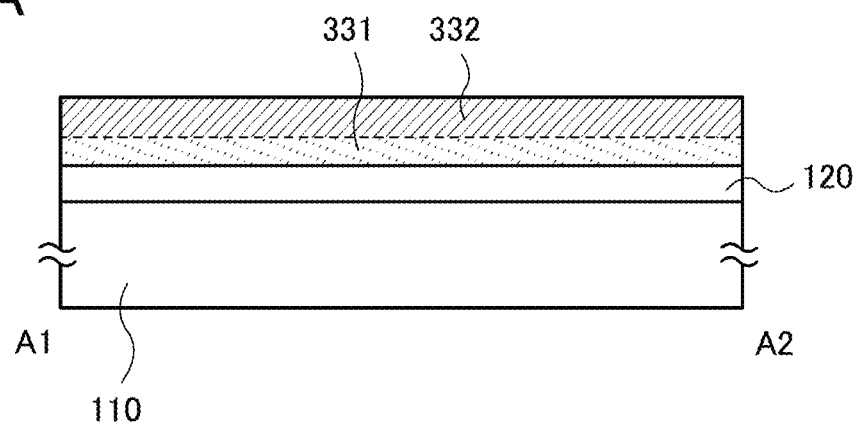
FIGS. 7A to 7C illustrate a method for manufacturing a transistor.

Next, a first oxide semiconductor film 331 to be the first oxide semiconductor layer 131 and a second oxide semiconductor film 332 to be the second oxide semiconductor layer 132 are deposited over the base insulating film 120 by a sputtering method, a CVD method, an MBE method, an ALD method, or a PLD method (see FIG. 7A).

Figure 7B:
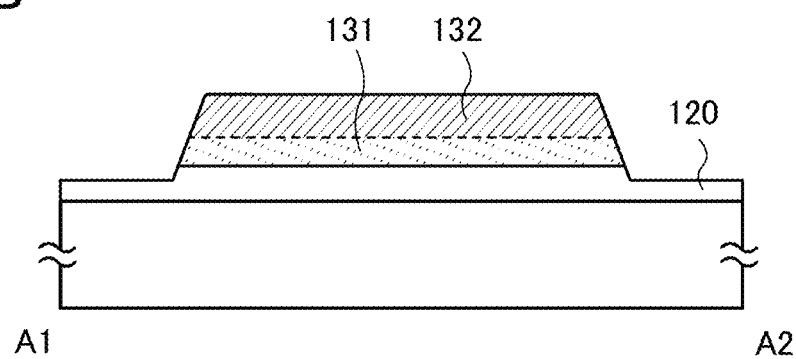

Subsequently, the first oxide semiconductor film 331 and the second oxide semiconductor film 332 are selectively etched to form the first oxide semiconductor layer 131 and the second oxide semiconductor layer 132 (see FIG. 7B). At this time, the base insulating film 120 may also be etched slightly as illustrated in FIG. 7B. The slightly etched base insulating film 120 enables the second oxide semiconductor layer 132 to be easily covered by the gate electrode that is formed later. Further, the second oxide semiconductor layer 132 is formed to have a curvature from its top surface to its side surface in the cross section in the channel width direction of the transistor.

Note that when the first oxide semiconductor film 331 and the second oxide semiconductor film 332 are selectively etched, not only a photoresist but also a hard mask such as a metal film can be used. In addition, an organic resin may be formed over the metal film. As the metal film, for example, a tungsten film with a thickness of approximately 5 nm can be used.

For the etching, dry etching in which a difference between the etching rate of the first oxide semiconductor film 331 and that of the second oxide semiconductor film 332 is small is preferably used.

In order to form a continuous energy band in a stack including the first oxide semiconductor layer 131 and the second oxide semiconductor layer 132, the layers are preferably formed successively without exposure to the air with the use of a multi-chamber deposition apparatus (e.g., a sputtering apparatus) including a load lock chamber. It is preferable that each chamber of the sputtering apparatus be able to be evacuated to a high vacuum (to approximately higher than or equal to $5 \times 10^{-7}$ Pa and lower than or equal to 1×10⁻⁴ Pa) by an adsorption vacuum pump such as a cryopump and that the chamber be able to heat a substrate over which a film is to be deposited to 100° C. or higher, preferably 500° C. or higher, so that water and the like acting as impurities of an oxide semiconductor are removed as much as possible. Alternatively, a combination of a turbo molecular pump and a cold trap is preferably used to prevent back-flow of a gas containing a carbon component, moisture, or the like from an exhaust system into the chamber.

Not only high vacuum evacuation of the chamber but also high purity of a sputtering gas is necessary to obtain a highly purified intrinsic oxide semiconductor. An oxygen gas or an argon gas used as the sputtering gas is highly purified to have a dew point of −40° C. or lower, preferably −80° C. or lower, further preferably −100° C. or lower, so that entry of moisture and the like into the oxide semiconductor layer can be prevented as much as possible.

For the first oxide semiconductor layer 131, the second oxide semiconductor layer 132, and the third oxide semiconductor layer 133 formed in a later step, any of the materials described in Embodiment 1 can be used. For example, an In—Ga—Zn oxide whose atomic ratio of In to Ga and Zn is 1:3:6, 1:3:4, 1:3:3, or 1:3:2 can be used for the first oxide semiconductor layer 131, an In—Ga—Zn oxide whose atomic ratio of In to Ga and Zn is 1:1:1 or 5:5:6 can be used for the second oxide semiconductor layer 132, and an In—Ga—Zn oxide whose atomic ratio of In to Ga and Zn is 1:3:6, 1:3:4, 1:3:3, or 1:3:2 can be used for the third oxide semiconductor layer 133.

An oxide semiconductor that can be used for each of the first oxide semiconductor layer 131, the second oxide semiconductor layer 132, and the third oxide semiconductor layer 133 preferably contains at least indium (In) or zinc (Zn). Alternatively, the oxide semiconductor preferably contains both In and Zn. In order to reduce variations in the electrical characteristics of the transistor including the oxide semiconductor, the oxide semiconductor preferably contains a stabilizer in addition to In and/or Zn.

Examples of a stabilizer include gallium (Ga), tin (Sn), hafnium (Hf), aluminum (Al), and zirconium (Zr). Other examples of a stabilizer are lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

Note that here, for example, an "In—Ga—Zn oxide" means an oxide containing In, Ga, and Zn as its main components. The In—Ga—Zn oxide may contain a metal element other than In, Ga, and Zn. Further, in this specification, a film formed using an In—Ga—Zn oxide is also referred to as an IGZO film.

Alternatively, a material represented by $InMO_3(ZnO)_m$ (m>0, where m is not an integer) may be used. Note that M represents one or more metal elements selected from Ga, Y, Zr, La, Ce, and Nd. Further alternatively, a material represented by $In_2SnO_5(ZnO)_n$ (n>0, where n is an integer) may be used.

Note that as described in Embodiment 1 in detail, materials are selected so that the first oxide semiconductor layer 131 and the third oxide semiconductor layer 133 each have an electron affinity lower than that of the second oxide semiconductor layer 132.

The oxide semiconductor layers are each preferably formed by a sputtering method. As a sputtering method, an RF sputtering method, a DC sputtering method, an AC sputtering method, or the like can be used.

In the case of using an In—Ga—Zn oxide, a material whose atomic ratio of In to Ga and Zn is any of 1:1:1, 2:2:1, 3:1:2, 5:5:6, 1:3:2, 1:3:3, 1:3:4, 1:3:6, 1:4:3, 1:5:4, 1:6:6, 2:1:3 1:6:4, 1:9:6, 1:1:4, and 1:1:2 is used for the first oxide semiconductor layer 131, the second oxide semiconductor layer 132, and/or the third oxide semiconductor layer 133 so that the first oxide semiconductor layer 131 and the third oxide semiconductor layer 133 each have an electron affinity lower than that of the second oxide semiconductor layer 132.

Note that for example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \leq r^2$, and r may be 0.05, for example. The same applies to other oxides.

The indium content of the second oxide semiconductor layer 132 is preferably higher than the indium content of the first oxide semiconductor layer 131 and the indium content of the third oxide semiconductor layer 133. In an oxide semiconductor, the s orbital of heavy metal mainly contributes to carrier transfer, and when the proportion of In in the oxide semiconductor is increased, overlap of the s orbitals is likely to be increased. Thus, an oxide having a composition in which the proportion of In is higher than that of Ga has higher mobility than an oxide having a composition in which the proportion of In is equal to or lower than that of Ga. For this reason, with the use of an oxide having a high indium content for the second oxide semiconductor layer 132, a transistor having high mobility can be achieved.

A structure of an oxide semiconductor film is described below.

Note that in this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 800 and less than or equal to 100°, and accordingly includes the case where the angle is greater than or equal to 850 and less than or equal to 95°.

In this specification, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around 56°. This peak is derived from the (110) plane of the $InGaZnO_4$ crystal. Here, analysis ($\varphi$ scan) is performed under conditions where the sample is rotated around a normal vector of a sample surface as an axis ($\varphi$ axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when (p scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a reduction in crystallinity. Further, a heavy metal such as iron or nickel, argon, carbon dioxide, or the like has a large atomic radius (or molecular radius), and thus disturbs the atomic arrangement of the oxide semiconductor film and causes a reduction in crystallinity when it is contained in the oxide semiconductor film. Note that the impurity contained in the oxide semiconductor film might serve as a carrier trap or a carrier generation source.

Further, the CAAC-OS film is an oxide semiconductor film having a low density of defect states. For example, an oxygen vacancy in the oxide semiconductor film serves as a carrier trap or a carrier generation source in some cases when hydrogen is captured therein.

The state in which the impurity concentration is low and the density of defect states is low (the number of oxygen vacancies is small) is referred to as a highly purified intrinsic state or a substantially highly purified intrinsic state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has small variations in electrical characteristics and high reliability. Electric charge trapped by the carrier traps in the oxide semiconductor film takes a long time to be released, and might behave like fixed electric charge. Thus, the transistor that includes the oxide semiconductor film having high impurity concentration and a high density of defect states has unstable electrical characteristics in some cases.

With the use of the CAAC-OS film in a transistor, variations in the electrical characteristics of the transistor due to irradiation with visible light or ultraviolet light are small.

Next, a microcrystalline oxide semiconductor film is described.

In an image obtained with a TEM, crystal parts cannot be found clearly in the microcrystalline oxide semiconductor film in some cases. In most cases, the size of a crystal part in the microcrystalline oxide semiconductor film is greater than or equal to 1 nm and less than or equal to 100 nm, or greater than or equal to 1 nm and less than or equal to 10 nm. An oxide semiconductor film including nanocrystal (nc), which is a microcrystal with a size greater than or equal to 1 nm and less than or equal to 10 nm, or a size greater than or equal to 1 nm and less than or equal to 3 nm, is specifically referred to as a nanocrystalline oxide semiconductor (nc-OS) film. In an image of the nc-OS film obtained with a TEM, for example, a crystal grain cannot be observed clearly in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is observed in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are observed in a nanobeam electron diffraction pattern of the nc-OS film obtained by using an electron beam having a probe diameter (e.g., larger than or equal to 1 nm and smaller than or equal to 30 nm) close to, or smaller than or equal to the diameter of a crystal part. In some cases, in a nanobeam electron diffraction pattern of the nc-OS film, regions with high luminance in a circular (ring) pattern are observed. Further, in a nanobeam electron diffraction pattern of the nc-OS film, a plurality of spots are shown in a ring-like region in some cases.

Since an nc-OS film is an oxide semiconductor film having more regularity than an amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than a CAAC-OS film.

Note that an oxide semiconductor film may be a stacked film including two or more films of an amorphous oxide semiconductor film, a microcrystalline oxide semiconductor film, and a CAAC-OS film, for example.

A CAAC-OS film can be deposited by a sputtering method with a polycrystalline oxide semiconductor sputtering target, for example. When ions collide with the sputtering target, a crystal region included in the sputtering target may be separated from the target along the a-b plane; in other words, a sputtered particle having a plane parallel to the a-b plane (a flat-plate-like sputtered particle or a pellet-like sputtered particle) might flake off from the target. In this case, the flat-plate-like sputtered particle or the pellet-like sputtered particle is electrically charged and thus reaches a substrate while maintaining its crystal state without being aggregated in plasma, whereby a CAAC-OS film can be formed.

In the case where the second oxide semiconductor layer 132 is formed using an In-M-Zn oxide (M is Ga, Y, Zr, La, Ce, or Nd) and a sputtering target whose atomic ratio of In to M and Zn is $a_1:b_1:c_1$ is used for forming the second oxide semiconductor layer 132, $a_1/b_1$ is preferably greater than or equal to ⅓ and less than or equal to 6, further preferably greater than or equal to 1 and less than or equal to 6, and $c_1/b_1$ is preferably greater than or equal to ⅓ and less than or equal to 6, further preferably greater than or equal to 1 and less than or equal to 6. Note that when $c_1/b_1$ is greater than or equal to 1 and less than or equal to 6, a CAAC-OS film is easily formed as the second oxide semiconductor layer 132. Typical examples of the atomic ratio of In to M and Zn of the target are 1:1:1, 3:1:2, and 5:5:6.

In the case where the first oxide semiconductor layer 131 and the third oxide semiconductor layer 133 are each formed using an In-M-Zn oxide (M is Ga, Y, Zr, La, Ce, or Nd) and a sputtering target whose atomic ratio of In to M and Zn is $a_2:b_2:c_2$ is used for forming the first oxide semiconductor layer 131 and the third oxide semiconductor layer 133, $a_2/b_2$ is preferably less than $a_1/b_1$, and $c_2/b_2$ is preferably greater than or equal to ⅓ and less than or equal to 6, further preferably greater than or equal to 1 and less than or equal to 6. Note that when $c_2/b_2$ is greater than or equal to 1 and less than or equal to 6, CAAC-OS films are easily formed as the first oxide semiconductor layer 131 and the third oxide semiconductor layer 133. Typical examples of the atomic ratio of In to M and Zn of the target are 1:3:2, 1:3:3, 1:3:4, and 1:3:6.

First heat treatment may be performed after the second oxide semiconductor layer 132 is formed. The first heat treatment may be performed at a temperature higher than or equal to 250° C. and lower than or equal to 650° C., preferably higher than or equal to 300° C. and lower than or equal to 500° C., in an inert gas atmosphere, in an atmosphere containing an oxidizing gas at 10 ppm or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more in order to compensate desorbed oxygen. By the first heat treatment, the crystallinity of the second oxide semiconductor layer 132 can be improved, and in addition, impurities such as hydrogen and water can be removed from the base insulating film 120 and the first oxide semiconductor layer 131. Note that the first heat treatment may be performed before etching for formation of the second oxide semiconductor layer 132.

Next, a first conductive film to be the source electrode layer 140 and the drain electrode layer 150 is formed over the first oxide semiconductor layer 131 and the second oxide semiconductor layer 132. For the first conductive film, Al, Cr, Cu, Ta, Ti, Mo, W, or an alloy material containing any of these as its main component can be used. For example, a 100-nm-thick titanium film is formed by a sputtering method or the like. Alternatively, a tungsten film may be formed by a CVD method.

Figure 7C:
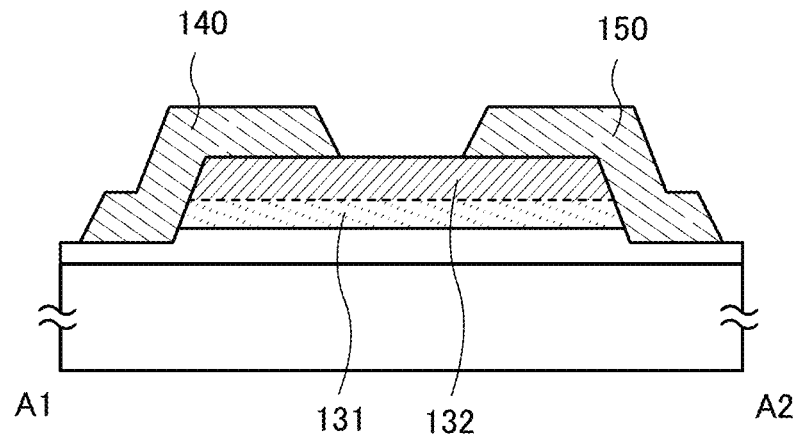

Then, the first conductive film is etched so as to be divided over the second oxide semiconductor layer 132 to form the source electrode layer 140 and the drain electrode layer 150 (see FIG. 7C). At this time, the first conductive film may be over-etched, so that the second oxide semiconductor layer 132 is partly etched.

Subsequently, a third oxide semiconductor film 333 to be the third oxide semiconductor layer 133 is formed over the first oxide semiconductor layer 131, the second oxide semiconductor layer 132, the source electrode layer 140, and the drain electrode layer 150. In the third oxide semiconductor film 333, a microcrystalline layer is formed in the vicinity of the interface with the second oxide semiconductor layer 132, and a crystalline layer in which c-axes are aligned is formed over the microcrystalline layer.

Note that second heat treatment may be performed after the third oxide semiconductor film 333 is formed. The second heat treatment can be performed under the conditions similar to those of the first heat treatment. The second heat treatment can remove impurities such as hydrogen and water from the third oxide semiconductor film 333, the first oxide semiconductor layer 131, and the second oxide semiconductor layer 132.

Next, an insulating film 360 to be the gate insulating film 160 is formed over the third oxide semiconductor film 333. The insulating film 360 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. The insulating film 360 may be a stack including any of the above materials. The insulating film 360 can be formed by a sputtering method, a CVD method, an MBE method, an ALD method, a PLD method, or the like.

Figure 8A:
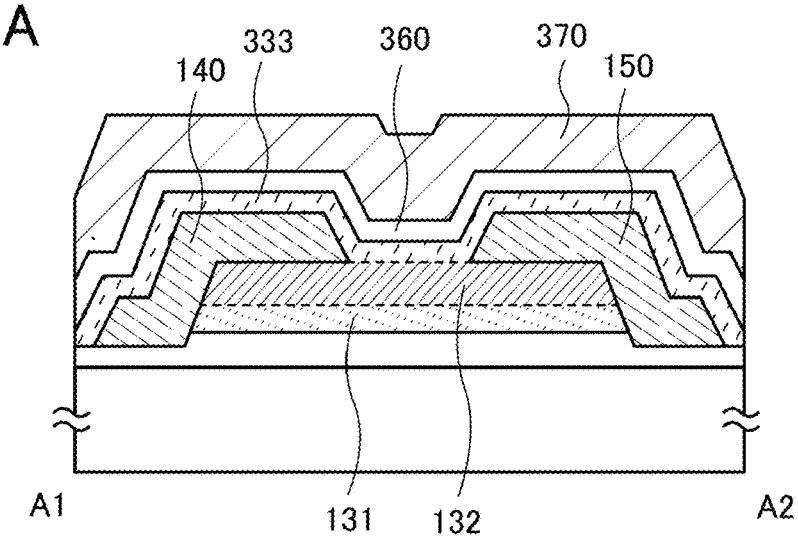
FIGS. 8A to 8C illustrate a method for manufacturing a transistor.

Then, a second conductive film 370 to be the gate electrode layer 170 is formed over the insulating film 360 (see FIG. 8A). For the second conductive film 370, Al, Ti, Cr, Co, Ni, Cu, Y, Zr, Mo, Ru, Ag, Ta, W, or an alloy material containing any of these as its main component can be used. The second conductive film 370 can be formed by a sputtering method, a CVD method, or the like. A stack including a conductive film containing any of the above materials and a conductive film containing nitrogen, or a conductive film containing nitrogen may be used for the second conductive film 370.

After that, the second conductive film 370 is selectively etched using a resist mask to form the gate electrode layer 170.

Then, the insulating film 360 is selectively etched using the resist mask or the gate electrode layer 170 as a mask to form the gate insulating film 160.

Figure 8B:
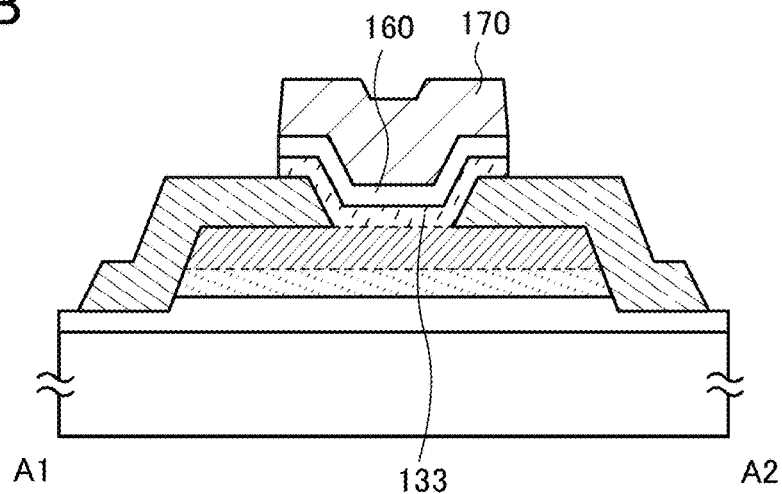

Subsequently, the third oxide semiconductor film 333 is etched using the resist mask or the gate electrode layer 170 as a mask to form the third oxide semiconductor layer 133 (see FIG. 8B).

The second conductive film 370, the insulating film 360, and the third oxide semiconductor film 333 may be etched individually or successively. Note that either dry etching or wet etching may be used as the etching method, and an appropriate etching method may be selected individually.

Figure 8C:
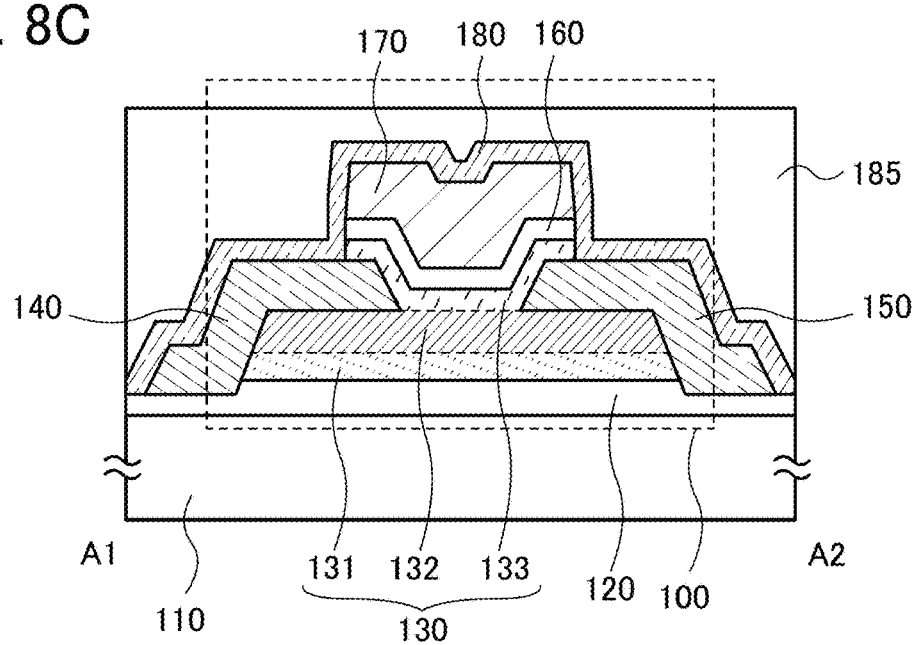

Next, the insulating layer 180 and the insulating layer 185 are formed over the source electrode layer 140, the drain electrode layer 150, and the gate electrode layer 170 (see FIG. 8C). The insulating layer 180 and the insulating layer 185 can be formed using a material and a method which are similar to those of the base insulating film 120. Note that it is particularly preferable to use aluminum oxide for the insulating layer 180.

Oxygen may be added to the insulating layer 180 by an ion implantation method, an ion doping method, a plasma immersion ion implantation method, or the like. Adding oxygen enables the insulating layer 180 to supply oxygen much easily to the oxide semiconductor layer 130.

Next, third heat treatment may be performed. The third heat treatment can be performed under conditions similar to those of the first heat treatment. By the third heat treatment, excess oxygen is easily released from the base insulating film 120, the gate insulating film 160, and the insulating layer 180, so that oxygen vacancies in the oxide semiconductor layer 130 can be reduced.

Through the above process, the transistor 100 illustrated in FIGS. 1A to 1C can be fabricated.

This embodiment can be combined as appropriate with any of the other embodiments and an example in this specification.

Embodiment 3

In this embodiment, an example of a semiconductor device (storage device) which includes the transistor of one embodiment of the present invention, which can retain stored data even when not powered, and which has an unlimited number of write cycles is described with reference to drawings.

Figure 9A:
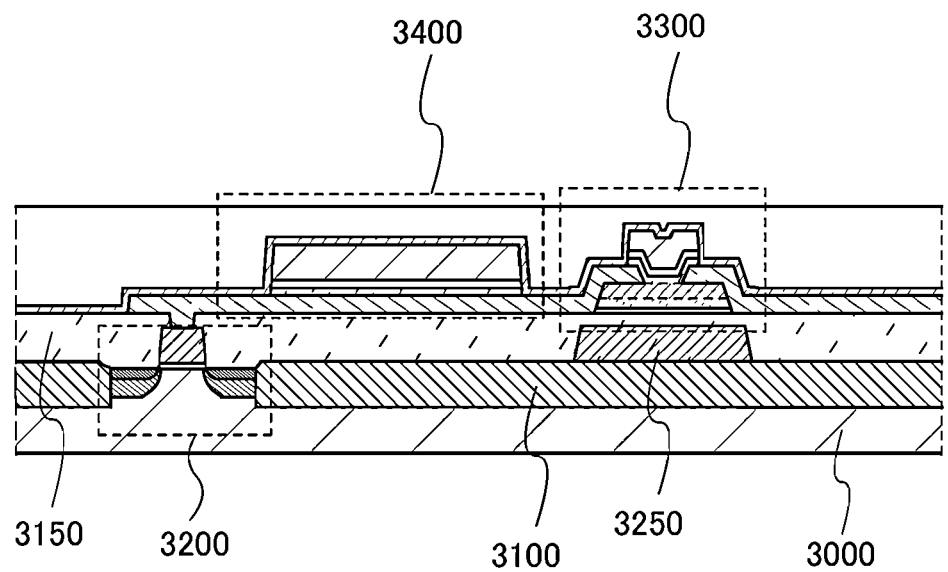
FIGS. 9A and 9B are a cross-sectional view and a circuit diagram of a semiconductor device.
Figure 9B:
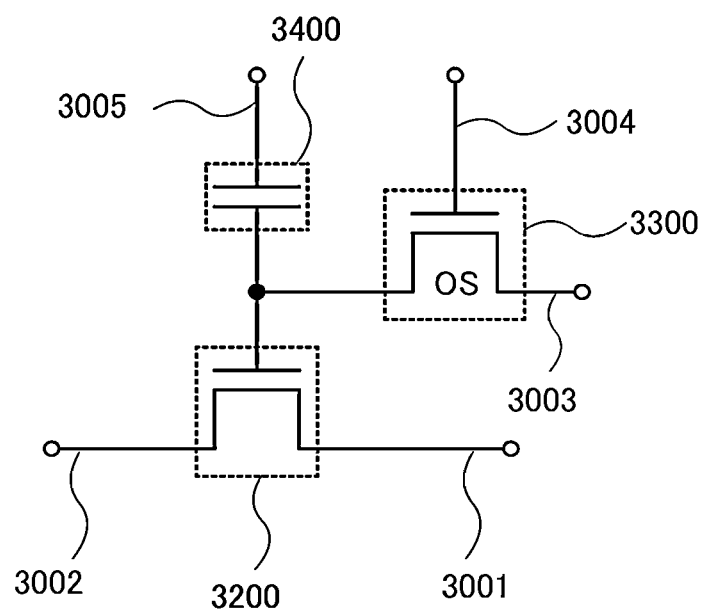

FIG. 9A is a cross-sectional view of the semiconductor device, and FIG. 9B is a circuit diagram of the semiconductor device.

The semiconductor device illustrated in FIGS. 9A and 9B includes a transistor 3200 including a first semiconductor material in a lower portion, and a transistor 3300 including a second semiconductor material and a capacitor 3400 in an upper portion. Note that the transistor 100 described in Embodiment 1 can be used as the transistor 3300.

One electrode of the capacitor 3400 is formed using the same material as a source electrode layer or a drain electrode layer of the transistor 3300, the other electrode of the capacitor 3400 is formed using the same material as a gate electrode layer of the transistor 3300, and a dielectric of the capacitor 3400 is formed using the same material as the gate insulating film 160 and the third oxide semiconductor layer 133 of the transistor 3300; thus, the capacitor 3400 can be formed at the same time as the transistor 3300.

Here, the first semiconductor material and the second semiconductor material preferably have different energy gaps. For example, the first semiconductor material may be a semiconductor material (such as silicon) other than an oxide semiconductor, and the second semiconductor material may be the oxide semiconductor described in Embodiment 1. A transistor including a material other than an oxide semiconductor can operate at high speed easily. In contrast, a transistor including an oxide semiconductor enables charge to be retained for a long time owing to its electrical characteristics, that is, the low off-state current.

Although both of the above transistors are n-channel transistors in the following description, it is needless to say that p-channel transistors can be used. The specific structure of the semiconductor device, such as a material used for the semiconductor device and the structure of the semiconductor device, needs not to be limited to that described here except for the use of the transistor described in Embodiment 1, which is formed using an oxide semiconductor, for retaining data.

The transistor 3200 in FIG. 9A includes a channel formation region provided in a substrate 3000 containing a semiconductor material (such as crystalline silicon), impurity regions provided such that the channel formation region is provided therebetween, intermetallic compound regions in contact with the impurity regions, a gate insulating film provided over the channel formation region, and a gate electrode layer provided over the gate insulating film. Note that a transistor whose source electrode layer and drain electrode layer are not illustrated in a drawing may also be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode layer" might include a source region.

An element isolation insulating layer 3100 is formed on the substrate 3000 so as to surround the transistor 3200, and an insulating layer 3150 is formed so as to cover the transistor 3200. Note that the element isolation insulating layer 3100 can be formed by an element isolation technique such as local oxidation of silicon (LOCOS) or shallow trench isolation (STI).

In the case where the transistor 3200 is formed using a crystalline silicon substrate, for example, the transistor 3200 can operate at high speed. Thus, when the transistor is used as a reading transistor, data can be read at high speed.

The transistor 3300 is provided over the insulating layer 3150, and the wiring electrically connected to the source electrode layer or the drain electrode layer of the transistor 3300 serves as the one electrode of the capacitor 3400. Further, the wiring is electrically connected to the gate electrode layer of the transistor 3200.

The transistor 3300 in FIG. 9A is a top-gate transistor in which a channel is formed in an oxide semiconductor layer. Since the off-state current of the transistor 3300 is low, stored data can be retained for a long period owing to such a transistor. In other words, refresh operation becomes unnecessary or the frequency of the refresh operation in a semiconductor storage device can be extremely low, which leads to a sufficient reduction in power consumption.

Further, an electrode 3250 is provided so as to overlap with the transistor 3300 with the insulating layer 3150 provided therebetween. By supplying an appropriate potential to the electrode 3250 and using the electrode 3250 as a second gate electrode, the threshold voltage of the transistor 3300 can be controlled. In addition, long-term reliability of the transistor 3300 can be improved. When the electrode operates with the same potential as that of the gate electrode of the transistor 3300, on-state current can be increased. Note that the electrode 3250 is not necessarily provided.

The transistor 3300 and the capacitor 3400 can be formed over the substrate over which the transistor 3200 is formed as illustrated in FIG. 9A, which enables the degree of the integration of the semiconductor device to be increased.

An example of a circuit configuration of the semiconductor device in FIG. 9A is illustrated in FIG. 9B.

In FIG. 9B, a first wiring 3001 is electrically connected to a source electrode layer of the transistor 3200. A second wiring 3002 is electrically connected to a drain electrode layer of the transistor 3200. A third wiring 3003 is electrically connected to one of the source electrode layer and the drain electrode layer of the transistor 3300. A fourth wiring 3004 is electrically connected to the gate electrode layer of the transistor 3300. The gate electrode layer of the transistor 3200 and the other of the source electrode layer and the drain electrode layer of the transistor 3300 are electrically connected to the one electrode of the capacitor 3400. A fifth wiring 3005 is electrically connected to the other electrode of the capacitor 3400. Note that a component corresponding to the electrode 3250 is not illustrated.

The semiconductor device in FIG. 9B utilizes a feature that the potential of the gate electrode layer of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode layer of the transistor 3200 and the capacitor 3400. That is, a predetermined charge is supplied to the gate electrode layer of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode layer of the transistor 3200 is retained (retaining).

Since the off-state current of the transistor 3300 is extremely low, the charge of the gate electrode layer of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode layer of the transistor 3200. This is because in general, in the case of using an n-channel transistor as the transistor 3200, an apparent threshold voltage $V_{th\_H}$ at the time when the high-level charge is given to the gate electrode layer of the transistor 3200 is lower than an apparent threshold voltage $V_{th\_L}$ at the time when the low-level charge is given to the gate electrode layer of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode layer of the transistor 3200 can be determined. For example, in the case where the high-level charge is supplied in writing and the potential of the fifth wiring 3005 is $V_0(>V_{th\_H})$, the transistor 3200 is turned on. In the case where the low-level charge is supplied in writing, even when the potential of the fifth wiring 3005 is $V_0(<V_{th\_L})$, the transistor 3200 remains off. Thus, the data retained in the gate electrode layer can be read by determining the potential of the second wiring 3002.

Note that in the case where memory cells are arrayed, it is necessary that only data of a desired memory cell be able to be read. The fifth wiring 3005 in the case where data is not read may be supplied with a potential at which the transistor 3200 is turned off regardless of the state of the gate electrode layer, that is, a potential lower than $V_{th\_H}$. Alternatively, the fifth wiring 3005 may be supplied with a potential at which the transistor 3200 is turned on regardless of the state of the gate electrode layer, that is, a potential higher than $V_{th\_L}$.

When including a transistor having a channel formation region formed using an oxide semiconductor and having an extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is unlikely to be caused. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

As described above, a miniaturized and highly integrated semiconductor device having high electrical characteristics can be provided.

This embodiment can be combined as appropriate with any of the other embodiments and an example in this specification.

Embodiment 4

In this embodiment, a semiconductor device including the transistor of one embodiment of the present invention, which can retain stored data even when not powered, which does not have a limit on the number of write cycles, and which has a structure different from that described in Embodiment 3, is described.

Figure 10:
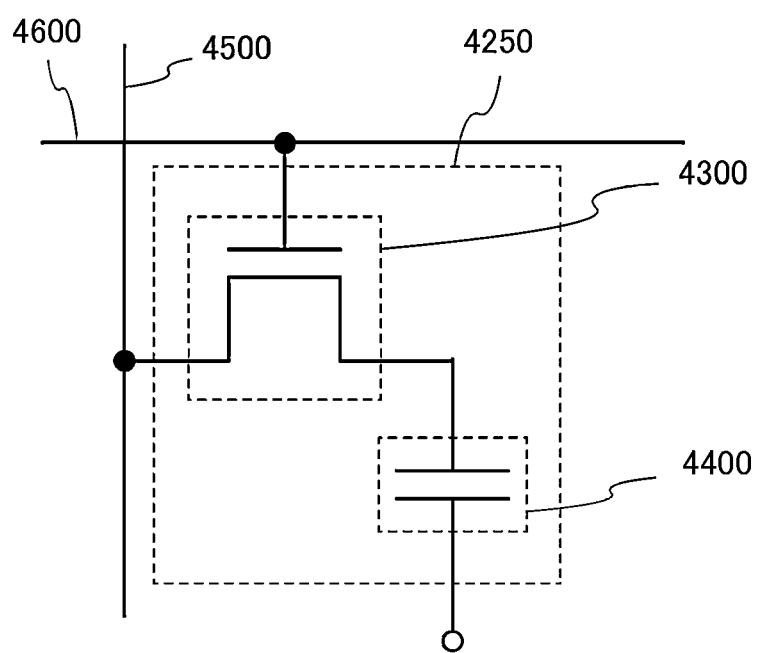
FIG. 10 is a circuit diagram of a semiconductor device.

FIG. 10 illustrates an example of a circuit configuration of the semiconductor device. In the semiconductor device, a first wiring 4500 is electrically connected to a source electrode layer of a transistor 4300, a second wiring 4600 is electrically connected to a gate electrode layer of the transistor 4300, and a drain electrode layer of the transistor 4300 is electrically connected to a first terminal of a capacitor 4400. Note that the transistor 100 described in Embodiment 1 can be used as the transistor 4300 included in the semiconductor device. The first wiring 4500 can serve as a bit line and the second wiring 4600 can serve as a word line.

The semiconductor device (a memory cell 4250) can have a connection mode similar to that of the transistor 3300 and the capacitor 3400 illustrated in FIGS. 9A and 9B. Thus, the capacitor 4400 can be formed in the same process and at the same time as the transistor 4300 in a manner similar to that of the capacitor 3400 described in Embodiment 3.

Next, writing and retaining of data in the semiconductor device (the memory cell 4250) illustrated in FIG. 10 are described.

First, a potential at which the transistor 4300 is turned on is supplied to the second wiring 4600, so that the transistor 4300 is turned on. Accordingly, the potential of the first wiring 4500 is supplied to the first terminal of the capacitor 4400 (writing). After that, the potential of the second wiring 4600 is set to a potential at which the transistor 4300 is turned off, so that the transistor 4300 is turned off. Thus, the potential of the first terminal of the capacitor 4400 is retained (retaining).

The transistor 4300 including an oxide semiconductor has an extremely low off-state current. For that reason, the potential of the first terminal of the capacitor 4400 (or a charge accumulated in the capacitor 4400) can be retained for an extremely long time by turning off the transistor 4300.

Next, reading of data is described. When the transistor 4300 is turned on, the first wiring 4500 which is in a floating state and the capacitor 4400 are electrically connected to each other, and the charge is redistributed between the first wiring 4500 and the capacitor 4400. As a result, the potential of the first wiring 4500 is changed. The amount of change in potential of the first wiring 4500 varies depending on the potential of the first terminal of the capacitor 4400 (or the charge accumulated in the capacitor 4400).

For example, the potential of the first wiring 4500 after the charge redistribution is $(C_B \times V_{B0} + C \times V)/(C_B + C)$, where V is the potential of the first terminal of the capacitor 4400, C is the capacitance of the capacitor 4400, $C_B$ is the capacitance component of the first wiring 4500, and $V_{B0}$ is the potential of the first wiring 4500 before the charge redistribution. Thus, it can be found that, assuming that the memory cell 4250 is in either of two states in which the potential of the first terminal of the capacitor 4400 is $V_1$ and $V_0 (V_1 > V_0)$, the potential of the first wiring 4500 in the case of retaining the potential $V_1$ $(=(C_B \times V_{B0} + C \times V_1)/(C_B + C))$ is higher than the potential of the first wiring 4500 in the case of retaining the potential $V_0 (=(C_B \times V_{B0} + C \times V_0)/(C_B + C))$.

Then, by comparing the potential of the first wiring 4500 with a predetermined potential, data can be read.

As described above, the semiconductor device (the memory cell 4250) illustrated in FIG. 10 can retain charge that is accumulated in the capacitor 4400 for a long time because the off-state current of the transistor 4300 is extremely low. In other words, refresh operation becomes unnecessary or the frequency of the refresh operation can be extremely low, which leads to a sufficient reduction in power consumption. Moreover, stored data can be retained for a long time even when power is not supplied.

A substrate over which a driver circuit for the memory cell 4250 is formed and the memory cell 4250 illustrated in FIG. 10 are preferably stacked. When the memory cell 4250 and the driver circuit are stacked, the size of the semiconductor device can be reduced. Note that there is no limitation on the numbers of the memory cells 4250 and the driver circuits which are stacked.

It is preferable that a semiconductor material of a transistor included in the driver circuit be different from that of the transistor 4300. For example, silicon, germanium, silicon germanium, silicon carbide, or gallium arsenide can be used, and a single crystal semiconductor is preferably used. A transistor formed using such a semiconductor material can operate at higher speed than a transistor formed using an oxide semiconductor and is suitable for the driver circuit for the memory cell 4250.

As described above, a miniaturized and highly integrated semiconductor device having high electrical characteristics can be provided.

This embodiment can be combined as appropriate with any of the other embodiments and an example in this specification.

Embodiment 5

In this embodiment, an example of a circuit including the transistor of one embodiment of the present invention will be described with reference to the drawings.

Figure 11A:
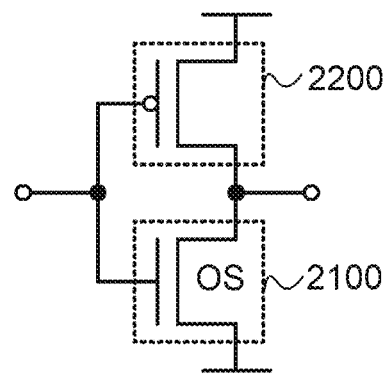
FIGS. 11A and 11B are each a circuit diagram of a semiconductor device and FIGS. 11C and 11D are each a cross-sectional view of a semiconductor device.
Figure 11B:
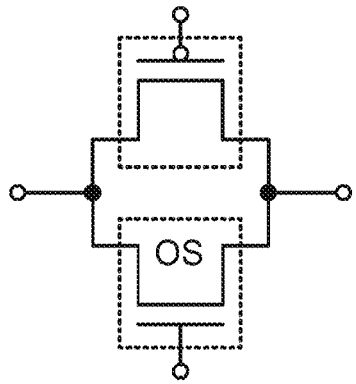
Figure 11C:
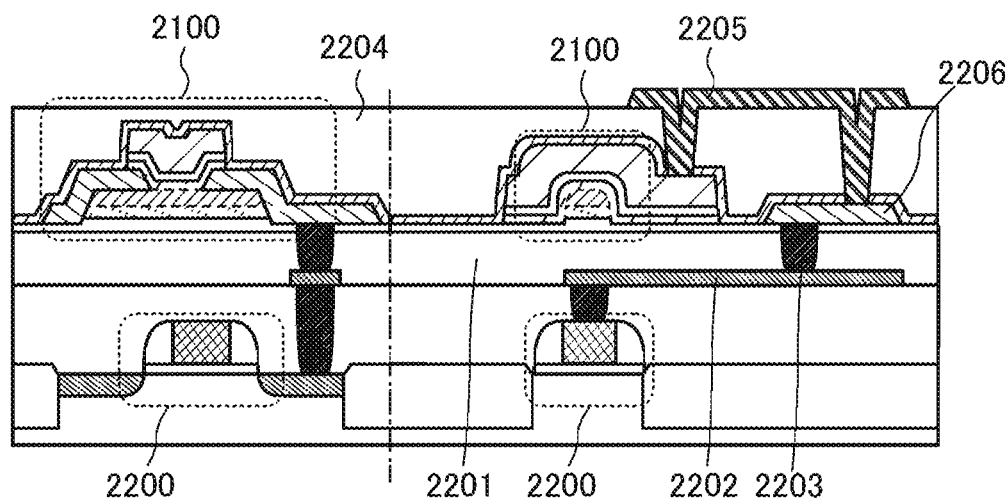
Figure 11D:
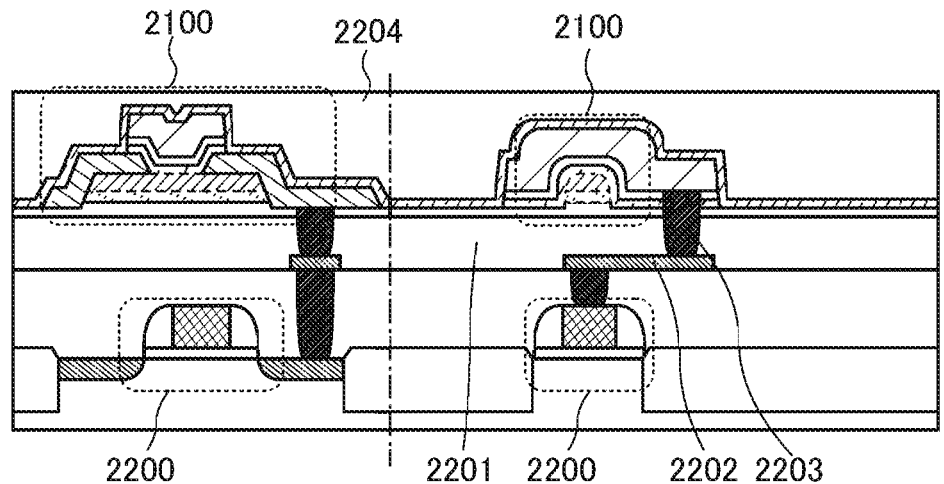

FIG. 11A is a circuit diagram of a semiconductor device and FIGS. 11C and 11D are each a cross-sectional view of a semiconductor device. FIGS. 11C and 11D each illustrate a cross-sectional view of a transistor 2100 in a channel length direction on the left and a cross-sectional view of the transistor 2100 in a channel width direction on the right. In the circuit diagram, "OS" is written beside a transistor in order to clearly demonstrate that the transistor includes an oxide semiconductor.

The semiconductor devices illustrated in FIGS. 11C and 11D each include a transistor 2200 containing a first semiconductor material in a lower portion and the transistor 2100 containing a second semiconductor material in an upper portion. Here, an example is described in which the transistor 100 described in Embodiment 1 as an example is used as the transistor 2100 containing the second semiconductor material.

Here, the first semiconductor material and the second semiconductor material preferably have different energy gaps. For example, the first semiconductor material may be a semiconductor material (e.g., silicon, germanium, silicon germanium, silicon carbide, or gallium arsenic) other than an oxide semiconductor, and the second semiconductor material may be the oxide semiconductor described in Embodiment 1. A transistor including single crystal silicon or the like as a material other than an oxide semiconductor can operate at high speed easily. In contrast, a transistor including an oxide semiconductor has the low off-state current.

Although the transistor 2200 is a p-channel transistor here, it is needless to say that an n-channel transistor can be used to form a circuit having a different configuration. The specific structure of the semiconductor device, such as a material used for the semiconductor device and the structure of the semiconductor device, needs not to be limited to that described here except for the use of the transistor described in Embodiment 1, which is formed using an oxide semiconductor.

FIGS. 11A, 11C, and 11D each illustrate a configuration example of what is called a CMOS circuit, in which a p-channel transistor and an n-channel transistor are connected in series and gates of the transistors are connected.

The circuit can operate at high speed because the transistor of one embodiment of the present invention including an oxide semiconductor has high on-state current.

FIG. 11C illustrates a configuration in which the transistor 2100 is provided over the transistor 2200 with an insulating layer 2201 provided therebetween. Further, a plurality of wirings 2202 are provided between the transistor 2200 and the transistor 2100. Furthermore, wirings and electrodes provided in the upper portion and the lower portion are electrically connected to each other through a plurality of plugs 2203 embedded in insulating layers. Note that an insulating layer 2204 covering the transistor 2100, a wiring 2205 over the insulating layer 2204, and a wiring 2206 formed by processing a conductive film that is also used for a pair of electrodes of the transistor are provided.

When two transistors are stacked as described above, the area occupied by the circuit can be reduced and a plurality of circuits can be arranged with higher density.

In FIG. 11C, one of a source and a drain of the transistor 2100 is electrically connected to one of a source and a drain of the transistor 2200 through the wirings 2202 and the plugs 2203. Further, the gate of the transistor 2100 is electrically connected to the gate of the transistor 2200 through the wiring 2205, the wiring 2206, the plugs 2203, the wiring 2202, and the like.

In the configuration illustrated in FIG. 11D, an opening portion in which the plug 2203 is embedded is provided in a gate insulating film of the transistor 2100, and the gate of the transistor 2100 is in contact with the plug 2203 through the opening portion. Such a configuration makes it possible to achieve the integration of the circuit easily and to reduce the lengths and the number of wirings and plugs used to be smaller than those in the configuration illustrated in FIG. 11C; thus, the circuit can operate at higher speed.

Note that when a connection between the electrodes of the transistor 2100 and the transistor 2200 is changed from that in the configuration illustrated in FIG. 11C or FIG. 11D, a variety of circuits can be formed. For example, a circuit having a configuration in which a source and a drain of a transistor are connected to those of another transistor as illustrated in FIG. 11B can operate as what is called an analog switch.

This embodiment can be combined as appropriate with any of the other embodiments and an example in this specification.

Embodiment 6

In this embodiment, a semiconductor device which includes the transistor of one embodiment of the present invention and has an image sensor function for reading data of an object will be described.

Figure 12:
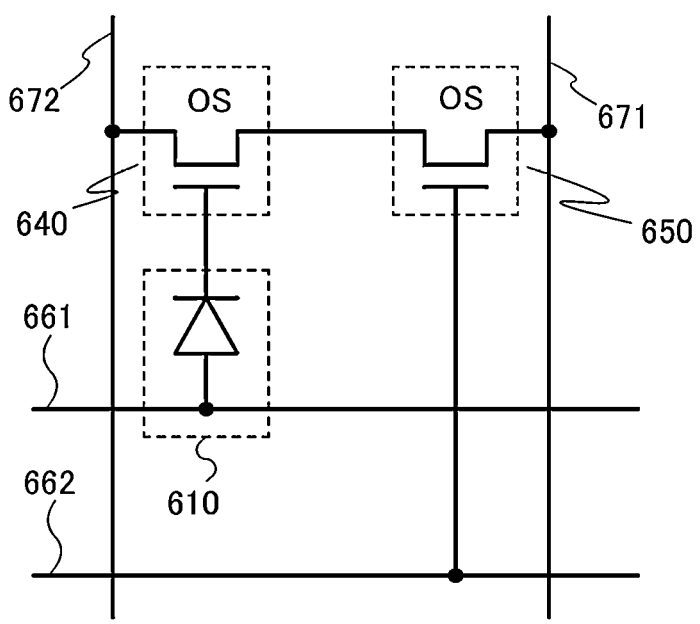
FIG. 12 is a circuit diagram of a semiconductor device.

FIG. 12 illustrates an example of an equivalent circuit of a semiconductor device having an image sensor function.

In a photodiode 610, one electrode is electrically connected to a photodiode reset signal line 661, and the other electrode is electrically connected to a gate of a transistor 640. One of a source and a drain of the transistor 640 is electrically connected to a photosensor reference signal line 672, and the other of the source and the drain thereof is electrically connected to one of a source and a drain of a transistor 650. A gate of the transistor 650 is electrically connected to a gate signal line 662, and the other of the source and the drain thereof is electrically connected to a photosensor output signal line 671.

As the photodiode 610, for example, a pin photodiode in which a semiconductor layer having p-type conductivity, a high-resistance semiconductor layer (semiconductor layer having i-type conductivity), and a semiconductor layer having n-type conductivity are stacked can be used.

With detection of light that enters the photodiode 610, data of an object can be read. Note that a light source such as a backlight can be used at the time of reading data of an object.

Note that as each of the transistor 640 and the transistor 650, the transistor 100 described in Embodiment 1 in which a channel is formed in an oxide semiconductor can be used. In FIG. 12, "OS" is written beside each of the transistor 640 and the transistor 650 so that it can be clearly identified that the transistors include an oxide semiconductor. The transistor 640 and the transistor 650 are electrically stable transistors that have high on-state current and less change in electrical characteristics. With the transistor, the semiconductor device having an image sensor function, which is illustrated in FIG. 12, can be highly reliable.

This embodiment can be combined as appropriate with any of the other embodiments and an example in this specification.

Embodiment 7

The transistor described in Embodiments 1 and 2 can be used in a semiconductor device such as a display device, a storage device, a CPU, a digital signal processor (DSP), an LSI such as a custom LSI or a programmable logic device (PLD), a radio frequency identification (RF-ID), an inverter, or an image sensor. In this embodiment, electronic devices each including the semiconductor device will be described.

Examples of the electronic devices having the semiconductor devices include display devices of televisions, monitors, and the like, lighting devices, personal computers, word processors, image reproduction devices, portable audio players, radios, tape recorders, stereos, phones, cordless phones, mobile phones, car phones, transceivers, wireless devices, game machines, calculators, portable information terminals, electronic notebooks, e-book readers, electronic translators, audio input devices, video cameras, digital still cameras, electric shavers, IC chips, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipment such as dialyzers and X-ray diagnostic equipment. In addition, the examples of the electronic devices include alarm devices such as smoke detectors, heat detectors, gas alarm devices, and security alarm devices. Further, the examples of the electronic devices also include industrial equipment such as guide lights, traffic lights, belt conveyors, elevators, escalators, industrial robots, and power storage systems. In addition, moving objects and the like driven by fuel engines and electric motors using power from non-aqueous secondary batteries are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, and spacecrafts. Some specific examples of these electronic devices are illustrated in FIGS. 13A to 13C.

Figure 13A:
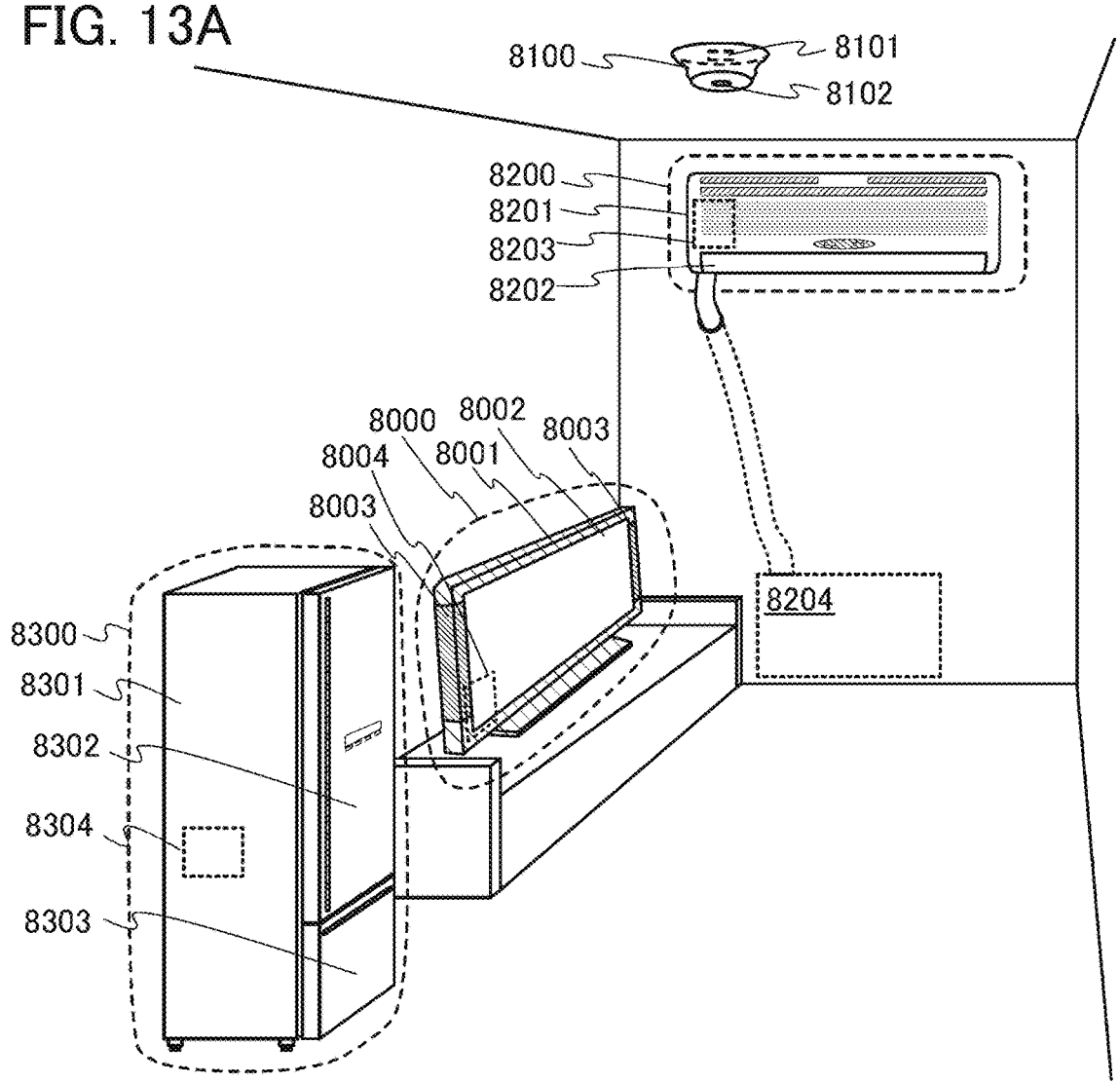
FIGS. 13A to 13C illustrate electronic devices in which semiconductor devices can be used.
Figure 13B:
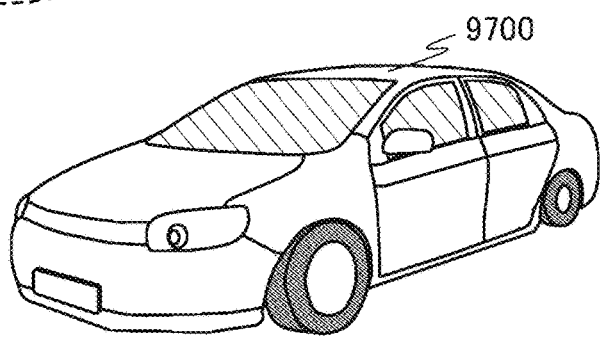
Figure 13C:
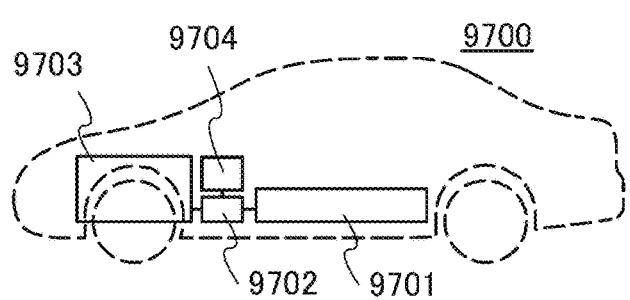

In a television set 8000 illustrated in FIG. 13A, a display portion 8002 is incorporated in a housing 8001. The display portion 8002 can display an image and a speaker portion 8003 can output sound. A storage device including the transistor of one embodiment of the present invention can be used for a driver circuit for operating the display portion 8002.

The television set 8000 may also include a CPU 8004 for performing information communication or a memory. For the CPU 8004 and the memory, a CPU or a storage device including the transistor of one embodiment of the present invention can be used.

An alarm device 8100 illustrated in FIG. 13A is a residential fire alarm, which is an example of an electronic device including a sensor portion 8102 for smoke or heat and a microcomputer 8101. Note that the microcomputer 8101 includes a storage device or a CPU including the transistor of one embodiment of the present invention.

An air conditioner which includes an indoor unit 8200 and an outdoor unit 8204 illustrated in FIG. 13A is an example of an electronic device including the transistor, the storage device, the CPU, or the like described in any of the above embodiments. Specifically, the indoor unit 8200 includes a housing 8201, an air outlet 8202, a CPU 8203, and the like. Although the CPU 8203 is provided in the indoor unit 8200 in FIG. 13A, the CPU 8203 may be provided in the outdoor unit 8204. Alternatively, the CPU 8203 may be provided in both the indoor unit 8200 and the outdoor unit 8204. By using any of the transistors of one embodiment of the present invention for the CPU in the air conditioner, a reduction in power consumption of the air conditioner can be achieved.

An electric refrigerator-freezer 8300 illustrated in FIG. 13A is an example of an electronic device including the transistor, the storage device, the CPU, or the like described in any of the above embodiments. Specifically, the electric refrigerator-freezer 8300 includes a housing 8301, a door for a refrigerator 8302, a door for a freezer 8303, a CPU 8304, and the like. In FIG. 13A, the CPU 8304 is provided in the housing 8301. When the transistor of one embodiment of the present invention is used for the CPU 8304 of the electric refrigerator-freezer 8300, a reduction in power consumption of the electric refrigerator-freezer 8300 can be achieved.

FIGS. 13B and 13C illustrate an example of an electric vehicle which is an example of an electronic device. An electric vehicle 9700 is equipped with a secondary battery 9701. The output of the electric power of the secondary battery 9701 is adjusted by a circuit 9702 and the electric power is supplied to a driving device 9703. The circuit 9702 is controlled by a processing unit 9704 including a ROM, a RAM, a CPU, or the like which is not illustrated. When the transistor of one embodiment of the present invention is used for the CPU in the electric vehicle 9700, a reduction in power consumption of the electric vehicle 9700 can be achieved.

The driving device 9703 includes a DC motor or an AC motor either alone or in combination with an internal-combustion engine. The processing unit 9704 outputs a control signal to the circuit 9702 on the basis of input data such as data of operation (e.g., acceleration, deceleration, or stop) by a driver or data during driving (e.g., data on an upgrade or a downgrade, or data on a load on a driving wheel) of the electric vehicle 9700. The circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts a direct current into an alternate current is also incorporated.

This embodiment can be combined as appropriate with any of the other embodiments and an example in this specification.

EXAMPLE

In this example, observation results of the stack including oxide semiconductor layers described in Embodiment 1 will be described in detail.

Figure 14:
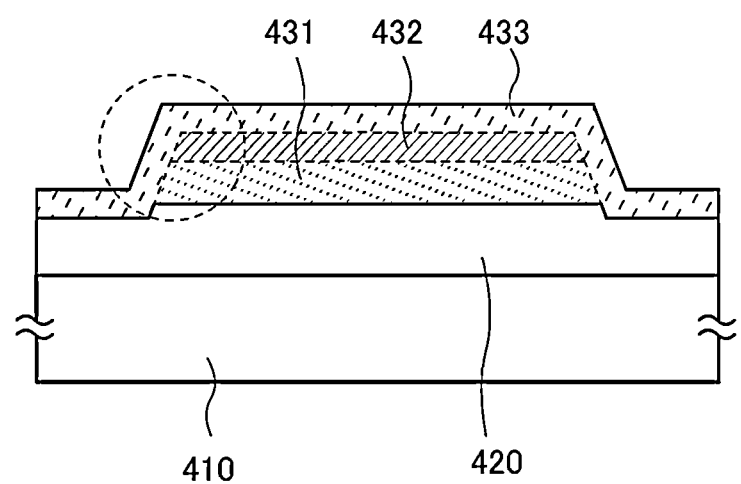
FIG. 14 is a cross-sectional view of a sample for observing a stacked structure of oxide semiconductor layers.

FIG. 14 is a cross-sectional view illustrating a structure of a sample used in this example. The sample includes a base insulating film 420 over a substrate 410, a stack including a first oxide semiconductor layer 431 and a second oxide semiconductor layer 432 over the base insulating film, and a third oxide semiconductor layer 433 formed over the stack. Note that the first oxide semiconductor layer 431, the second oxide semiconductor layer 432, and the third oxide semiconductor layer 433 correspond to the first oxide semiconductor layer 131, the second oxide semiconductor layer 132, and the third oxide semiconductor layer 133 described in Embodiment 1, respectively.

Here, a method for forming the sample illustrated in FIG. 14 is described.

First, a silicon wafer was used as the substrate 410, and the silicon wafer was subjected to thermal oxidation to form a silicon oxide film serving as the base insulating film 420.

Next, a first In—Ga—Zn oxide film whose atomic ratio of In to Ga and Zn is 1:3:4 and a second In—Ga—Zn oxide film whose atomic ratio of In to Ga and Zn is 1:1:1 were successively formed over the base insulating film 420 by a sputtering method. Note that the thickness of the first In—Ga—Zn oxide film and the thickness of the second In—Ga—Zn oxide film were 20 nm and 15 nm, respectively.

The first In—Ga—Zn oxide film was formed under the following conditions: an In—Ga—Zn oxide whose diameter is 8 inches and whose atomic ratio of In to Ga and Zn is 1:3:4 was used as a target, a sputtering gas containing argon and oxygen at a flow rate of 2:1 was used, the deposition pressure was 0.4 Pa, the electric power (DC) of 0.5 kW was supplied, the distance between the target and the substrate was 60 mm, and the substrate temperature was 200° C.

The second In—Ga—Zn oxide film was formed under the following conditions: an In—Ga—Zn oxide whose diameter is 8 inches and whose atomic ratio of In to Ga and Zn is 1:1:1 was used as a target, a sputtering gas containing argon and oxygen at a flow rate of 2:1 was used, the deposition pressure was 0.4 Pa, the electric power (DC) of 0.5 kW was supplied, the distance between the target and the substrate was 60 mm, and the substrate temperature was 300° C.

Then, the first In—Ga—Zn oxide film and the second In—Ga—Zn oxide film were subjected to heat treatment at 450° C. in a nitrogen atmosphere for one hour, and then subjected to heat treatment at 450° C. in an oxygen atmosphere for one hour.

After that, a 5-nm-thick tungsten film and a 20-nm-thick organic resin were formed over the second In—Ga—Zn oxide film, and a resist mask was formed by electron beam exposure.

Then, the organic resin and the tungsten film were selectively etched using the resist mask. As the etching, two steps of etching were performed using an inductively coupled plasma dry etching apparatus.

The first step of etching was performed under the following conditions: 100% carbon tetrafluoride was used as an etching gas, the pressure was 0.67 Pa, the electric power of 2000 W was supplied, the bias power was 50 W, the substrate temperature was −10° C., and the etching time was 12 seconds. The second step of etching was performed under the following conditions: an etching gas containing carbon tetrafluoride and oxygen at a flow rate of 3:2 was used, the pressure was 2.0 Pa, the electric power of 1000 W was supplied, the substrate bias power was 25 W, the substrate temperature was −10° C., and the etching time was 8 seconds.

Next, the first In—Ga—Zn oxide film and the second In—Ga—Zn oxide film were selectively etched using the organic resin and the tungsten film as a mask, so that a stack including the first oxide semiconductor layer 431 and the second oxide semiconductor layer 432 was formed. The etching was performed under the following conditions: an inductively coupled plasma dry etching apparatus was used, an etching gas containing methane and argon at a flow rate of 1:2 was used, the pressure was 1.0 Pa, the electric power of 600 W was supplied, the substrate bias power was 100 W, the substrate temperature was 70° C., and the etching time was 82 seconds.

After that, the organic resin and the tungsten film were etched under the following conditions: an inductively coupled plasma dry etching apparatus was used, an etching gas containing carbon tetrafluoride and oxygen at a flow rate of 3:2 was used, the pressure was 2.0 Pa, the electric power of 1000 W was supplied, the substrate bias power was 25 W, the substrate temperature was −10° C., and the etching time was 6 seconds.

Then, the third oxide semiconductor layer 433 was formed to have a thickness of 10 nm over the stack including the first oxide semiconductor layer 431 and the second oxide semiconductor layer 432 by a sputtering method.

The third oxide semiconductor layer 433 was formed under the following conditions: an In—Ga—Zn oxide whose diameter is 8 inches and whose atomic ratio of In to Ga and Zn is 1:3:4 was used as a target, a sputtering gas containing argon and oxygen at a flow rate of 2:1 was used, the deposition pressure was 0.4 Pa, the electric power (DC) of 0.5 kW was supplied, the distance between the target and the substrate was 60 mm, and the substrate temperature was 200° C.

Figure 15A:
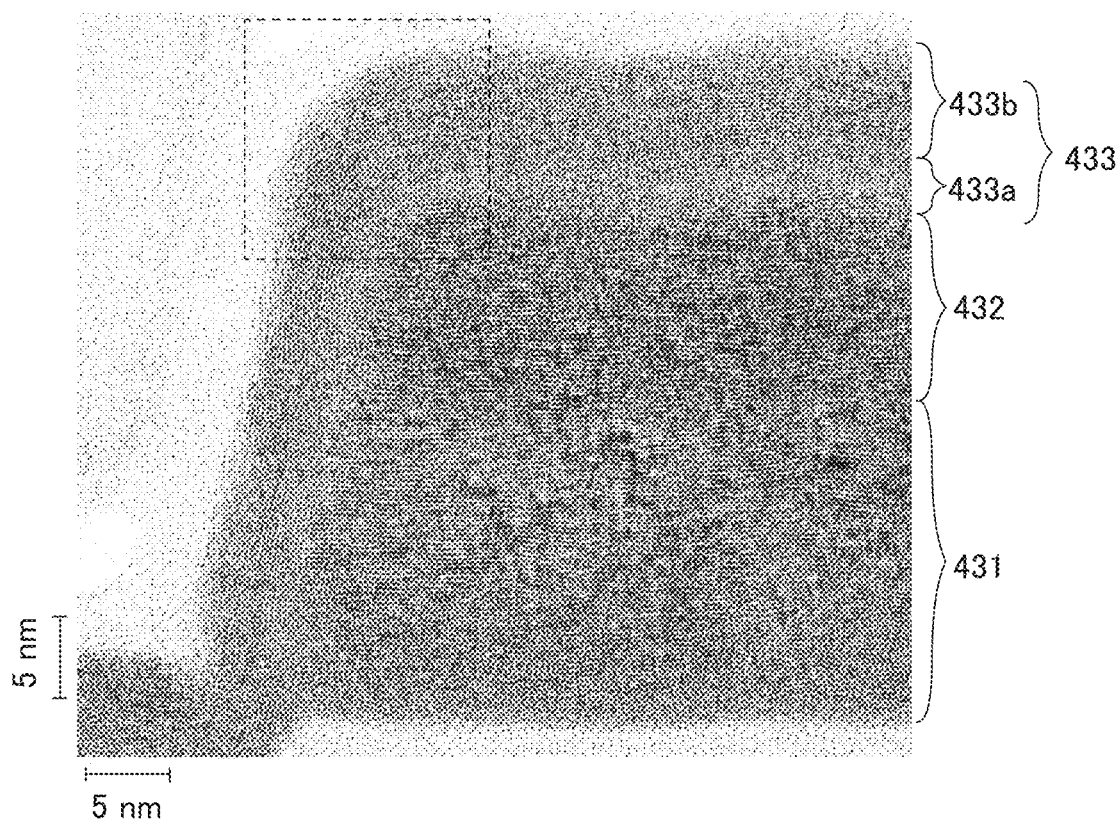
FIGS. 15A and 15B are each a cross-sectional TEM photograph of oxide semiconductor layers.

FIG. 15A is a cross-sectional TEM image of a region surrounded by a dotted line in FIG. 14. Although a crystal lattice is not observed in a region of several nanometers in the first oxide semiconductor layer 431 on the base insulating film 420 side, lattice fringes are observed in an upper portion of the region. Further, in the second oxide semiconductor layer 432, lattice fringes that are similar to those in the first oxide semiconductor layer 431 are observed. This means that the most part of the first oxide semiconductor layer 431 and the whole second oxide semiconductor layer 432 are formed of crystalline layers, and the directions of the lattice fringes demonstrate that the crystalline layers are each a CAAC-OS film in which c-axes are aligned in the direction perpendicular to its deposition surface.

In addition, although a crystal lattice is not observed in a region of several nanometers in the third oxide semiconductor layer 433 on the first oxide semiconductor layer 431 side or on the second oxide semiconductor layer 432 side, lattice fringes are observed in an upper portion of the region. This indicates that the third oxide semiconductor layer 433 includes a microcrystalline layer 433a and a crystalline layer 433b.

The lattice fringes in the crystalline layer 433b have different directions in a region over the second oxide semiconductor layer 432 and in a region that is formed to face a side surface of the first oxide semiconductor layer 431 or the second oxide semiconductor layer 432, which indicates that the crystalline layer 433b is a CAAC-OS film in which c-axes are aligned in the direction perpendicular to its deposition surface.

Figure 15B:

Further, as apparent from FIG. 15B, which is an enlarged view of a region surrounded by dotted lines in FIG. 15A, over a curved surface of an edge portion of the second oxide semiconductor layer 432, crystal fringes of the crystalline layer 433b in which c-axes are aligned in a direction perpendicular to the curved surface, with the microcrystalline layer 433a provided therebetween, are observed.

The above results of this example indicate that the stack including the oxide semiconductor layers, which is one embodiment of the present invention, can be formed.

This embodiment can be combined as appropriate with any of the other embodiments in this specification.

This application is based on Japanese Patent Application serial no. 2013-106337 filed with Japan Patent Office on May 20, 2013, the entire contents of which are hereby incorporated by reference.

What is claimed is:
1. A semiconductor device comprising:
a first oxide semiconductor layer;
a second oxide semiconductor layer over and in contact with the first oxide semiconductor layer;

a third oxide semiconductor layer over and in contact with the second oxide semiconductor layer;
a gate insulating film over the third oxide semiconductor layer; and
a gate electrode layer over the gate insulating film,
wherein an indium content of the second oxide semiconductor layer is higher than an indium content of the first oxide semiconductor layer,
wherein the indium content of the second oxide semiconductor layer is higher than an indium content of the third oxide semiconductor layer,
wherein the third oxide semiconductor layer comprises a first region, a second region, and a third region,
wherein the second region is positioned between the first region and the third region,
wherein a top surface of the second region is lower than a top surface of the first region, and
wherein a top surface of the second region is lower than a top surface of the third region.

2. The semiconductor device according to claim 1,
wherein a conduction band minimum of the second oxide semiconductor layer is lower than a conduction band minimum of the first oxide semiconductor layer, and
wherein the conduction band minimum of the second oxide semiconductor layer is lower than a conduction band minimum of the third oxide semiconductor layer.

3. A semiconductor device comprising:
a first oxide semiconductor layer;
a second oxide semiconductor layer over and in contact with the first oxide semiconductor layer;
a third oxide semiconductor layer over and in contact with the second oxide semiconductor layer;
a gate insulating film over the third oxide semiconductor layer; and
a gate electrode layer over the gate insulating film,
wherein an indium content of the second oxide semiconductor layer is higher than an indium content of the first oxide semiconductor layer,
wherein the indium content of the second oxide semiconductor layer is higher than an indium content of the third oxide semiconductor layer,
wherein the third oxide semiconductor layer comprises a first layer and a second layer over the first layer, and
wherein the first layer and the second layer have different crystallinities.

4. The semiconductor device according to claim 3,
wherein a conduction band minimum of the second oxide semiconductor layer is lower than a conduction band minimum of the first oxide semiconductor layer, and
wherein the conduction band minimum of the second oxide semiconductor layer is lower than a conduction band minimum of the third oxide semiconductor layer.

5. A semiconductor device comprising:
a first oxide semiconductor layer;
a second oxide semiconductor layer over and in contact with the first oxide semiconductor layer; and
a third oxide semiconductor layer over and in contact with the second oxide semiconductor layer,
wherein an indium content of the second oxide semiconductor layer is higher than an indium content of the first oxide semiconductor layer, and
wherein the indium content of the second oxide semiconductor layer is higher than an indium content of the third oxide semiconductor layer.

6. The semiconductor device according to claim 5,
wherein a gate insulating film is positioned over and in contact with the third region of the third oxide semiconductor layer, and
wherein a gate electrode layer is positioned over the gate insulating film.

7. The semiconductor device according to claim 2,
wherein a conduction band minimum of the second oxide semiconductor layer is lower than a conduction band minimum of the first oxide semiconductor layer, and
wherein the conduction band minimum of the second oxide semiconductor layer is lower than a conduction band minimum of the third oxide semiconductor layer.

* * * * *